US012720873B2

(12) United States Patent
Mathur et al.

(10) Patent No.: US 12,720,873 B2
(45) Date of Patent: Aug. 25, 2026

(54) TRANSCEIVER ARCHITECTURE WITH LOW KICK-BACK NOISE AND PAD CAP

(71) Applicant: SanDisk Technologies, Inc., Addison, CA (US)

(72) Inventors: Shiv Harit Mathur, Bangalore (IN); Sai Ravi Teja Konakalla, Bangalore (IN); Niravkumar Natwarbhai Patel, Bangalore (IN); Utkarsh Srivastava, Bengaluru (IN); Gopikrishna Siddula, Bangalore (IN)

(73) Assignee: Sandisk Technologies, Inc., Milpitas, CA (US)

( * ) Notice: Subject to any disclaimer, the term of this patent is extended or adjusted under 35 U.S.C. 154(b) by 474 days.

(21) Appl. No.: 18/362,568

(22) Filed: Jul. 31, 2023

(65) Prior Publication Data

US 2024/0304615 A1 Sep. 12, 2024

Related U.S. Application Data

(60) Provisional application No. 63/489,685, filed on Mar. 10, 2023.

(51) Int. Cl.
*H10D 89/60* (2025.01)
*H03K 17/687* (2006.01)
(Continued)

(52) U.S. Cl.
CPC ....... *H10D 89/921* (2025.01); *H03K 17/6871* (2013.01); *H04B 1/04* (2013.01); *H10D 84/85* (2025.01)

(58) Field of Classification Search
CPC .. H10D 89/921; H10D 84/85; H03K 17/6871; H04B 1/04; G11C 29/021; G11C 5/147; G11C 7/1096; G11C 29/022
See application file for complete search history.

(56) References Cited

U.S. PATENT DOCUMENTS 8,212,590 B2 * 7/2012 Wang ............... H03K 3/356113
327/108
8,344,760 B2 * 1/2013 Du ....................... G11C 7/1051
327/108

(Continued)

OTHER PUBLICATIONS

Rajagopal, "Dynamically Biased Low Power High Performance 3.3V Output Buffer in a Single Well Bulk CMOS 1.8V Oxide 45nm Process," 13th Int'l Symposium on Quality Electronic Design (ISQED), Mar. 2012, 6 pages (https://doi.org/10.1109/ISQED.2012.6187489).

*Primary Examiner* — Vanthu T Nguyen
(74) *Attorney, Agent, or Firm* — Pearl Cohen LLP

(57) ABSTRACT

Embodiments of the present technology provide transceivers intelligently designed to reduce voltage kickback and I/O pad capacitance. A transceiver of the present technology can reduce voltage kickback by dynamically tracking I/O pad voltage at gate terminals of reference voltage signal-receiving MOS devices of a voltage mode cascoded driver implemented in the transceiver. By tracking I/O pad voltage, embodiments can reduce/avoid rapidly changing voltage differentials across the reference voltage signal-receiving MOS devices—thereby reducing voltage kickback. By reducing voltage kickback, embodiments can maintain reliability and improve performance for the transceiver. Tracking I/O pad voltage at the gate terminals of the reference voltage signal-receiving MOS devices can also reduce I/O pad capacitance of the transceiver—thereby improving performance for the transceiver.

20 Claims, 19 Drawing Sheets

(51) Int. Cl.
*H04B 1/04* (2006.01)
*H10D 84/85* (2025.01)

(56) References Cited

U.S. PATENT DOCUMENTS

| | | | |
|---|---|---|---|
| 8,994,412 | B2 | 3/2015 | Kim |
| 9,000,799 | B1 | 4/2015 | Rajagopal |
| 10,204,676 | B2 | 2/2019 | Gu |
| 10,348,301 | B2 | 7/2019 | Lee |

* cited by examiner

700

| Enable Signals | Value in TX mode | Value in RX mode |
| --- | --- | --- |
| ENABLE_18 | REFN | 0 |
| ENABLE_B_18 | 0 | REFN |
| ENABLE_33 | VDDO | REFP |
| ENABLE_B_33 | REFP | VDDO |

| Decap on REFP And REFN (w.r.t. VSSO) | V kickback: max (refp,refn) (peak to peak) (mV) | | % Reduction in kick-back from Conventional design | PAD cap (fF) | | % Reduction In PAD cap from Conventional design |
|---|---|---|---|---|---|---|
| | Conventional structure | Proposed structure | | Conventional structure | Proposed structure | |
| 16pF | 63.428 | 11.383 | 82.1 | 453.61 | 184.26 | 59.4 |
| 8pF | 134.26 | 24.262 | 81.9 | 453.63 | 184.24 | 59.4 |
| 4pF | 266.59 | 48.796 | 81.7 | 453.64 | 184.28 | 59.4 |
| 2pF | 506.59 | 94.646 | 81.3 | 453.79 | 184.25 | 59.4 |
| 1pF | 917.82 | 177.22 | 80.7 | 453.8 | 184.25 | 59.4 |

FIG. 10

TRANSCEIVER ARCHITECTURE WITH LOW KICK-BACK NOISE AND PAD CAP

CROSS REFERENCE TO RELATED APPLICATIONS

This application claims the benefit of and priority to U.S. Provisional Patent Application No. 63/489,685, filed on Mar. 10, 2023, the contents of which are incorporated herein by reference in their entirety.

DESCRIPTION OF RELATED ART

A semiconductor transceiver device (referred to herein as a transceiver) may send and receive signals to and from the outside world via an input/output (I/O) pad (or pin).

When the transceiver is transmitting (i.e., in a transmitter mode) a voltage mode driver of the transceiver can drive voltage of the I/O pad to desired values—thereby transmitting desired signals to the outside world. When the transceiver is receiving (i.e., in a receiver mode), voltage of the I/O pad is driven by external signals received from the outside world.

One type of voltage mode driver used in transceivers is a voltage mode cascoded driver. An example voltage mode cascoded driver may include four metal-oxide-semiconductor (MOS) devices (see e.g., FIG. 5). Gate terminals of two of the MOS devices may be supplied with data-driven voltage signals (i.e., voltages associated with signals desired to be transmitted to the outside world via the I/O pad). Gate terminals of the other two MOS devices may be supplied with "reference voltage signals" that protect the MOS devices and other components of the transceiver.

Voltage mode cascoded drivers can enable transceivers implementations using low voltage-tolerant devices. By enabling implementations with low voltage-tolerant devices (as compared to larger and sometimes more expensive high voltage-tolerant devices), voltage mode cascoded drivers can reduce costs and footprints for the transceivers in which they are implemented.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

FIG. 7 depicts an example table displaying values for enable voltage signals supplied to gate terminals of pull-up and pull-down transistors of reference voltage kickback reduction circuits of the present technology.

FIG. 10 illustrates example experimental results comparing reference voltage kickback and I/O pad capacitance for an example conventional transceiver vs. an example transceiver of the present technology.

Figure 1:
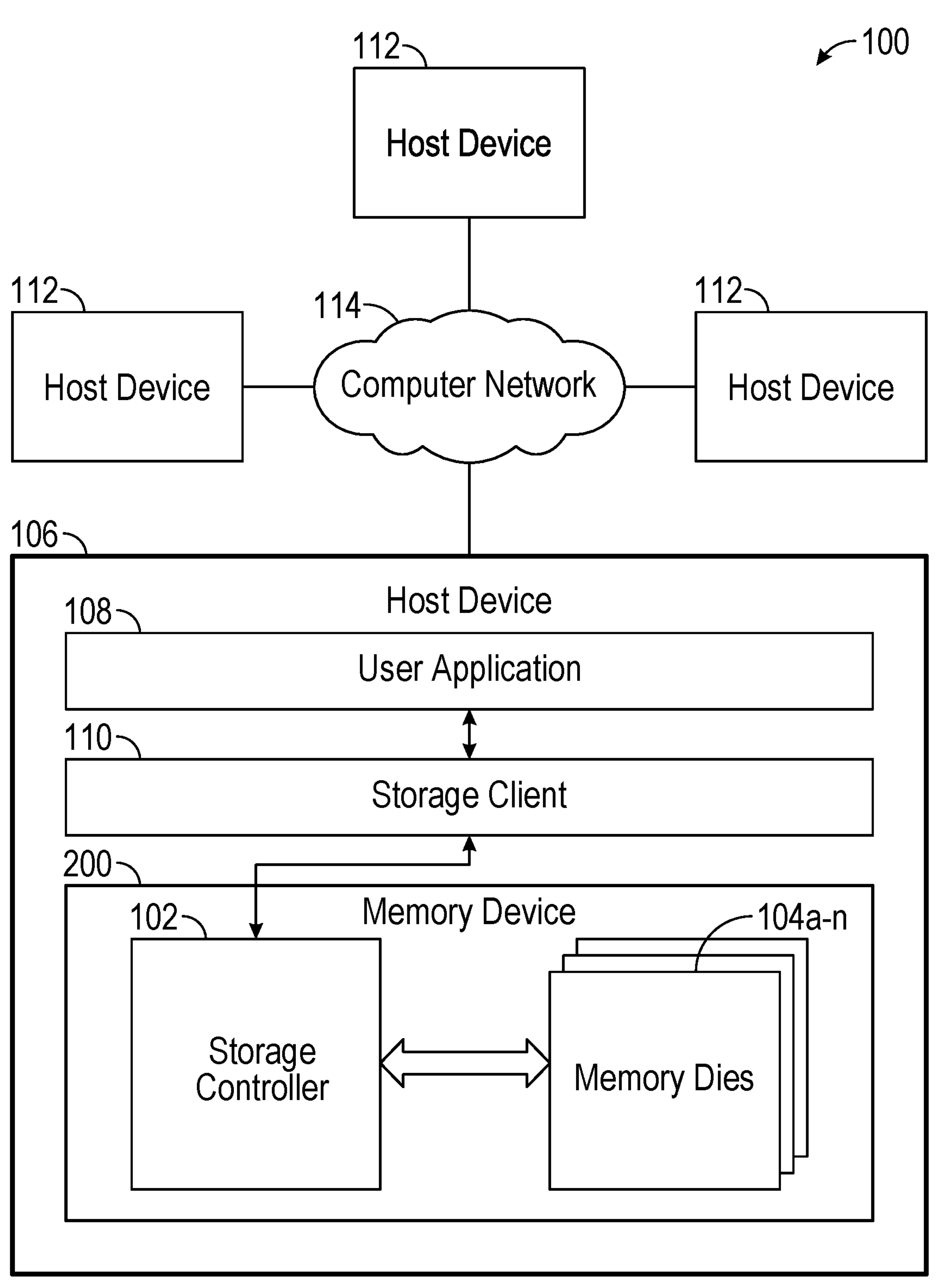
FIG. 1 is a block diagram of an example memory system, in connection with which, example embodiments of the disclosed technology can be implemented.

The figures are not exhaustive and do not limit the present disclosure to the precise form disclosed.

DETAILED DESCRIPTION

As alluded to above, reference voltage signals can protect components of a voltage mode cascoded driver and a transceiver in which the voltage mode cascoded driver is implemented. These reference voltage signals are particularly selected, and in general, must operate within a narrow tolerance of their values in order to provide optimal protection.

However, reference voltage signals can be disturbed by "voltage kickback" experienced at reference voltage signal-receiving MOS devices of the voltage mode cascoded driver (as used herein, "voltage kickback" may refer to a rapid change of voltage/voltage differential across a device). For example, when the transceiver is in a receiver mode, voltage of its I/O pad may toggle between a maximum and minimum voltage in accordance with external voltage signals received via the I/O pad. This toggling of I/O pad voltage can cause voltage kickback at the reference voltage signal-receiving MOS devices of the voltage mode cascoded driver as drain terminals of the reference voltage signal-receiving MOS devices are electrically connected to the I/O pad. This voltage kickback can disturb (e.g., cause noise on) the reference voltage signals such that they provide reduced protection to the MOS devices and other components of the transceiver. With such reduced protection, reliability for the transceiver may be reduced. The voltage kickback can also reduce performance for the transceiver.

In general, voltage kickback can be reduced by using "strong" voltage sources to supply reference voltage signals (these voltage sources are characterized as "strong" as they have relatively lower impedance as compared to "weak" voltage sources). However, strong voltage sources can be more expensive and difficult to implement in a transceiver than "weak" voltage sources having relatively higher impedance. Moreover, even strong voltage sources are susceptible to voltage kickback.

Against this backdrop, embodiments of the present technology provide transceivers intelligently designed to reduce voltage kickback. In particular, transceivers of the present technology can reduce voltage kickback by dynamically tracking I/O pad voltage at gate terminals of reference voltage signal-receiving MOS devices of a voltage mode cascoded driver. By tracking I/O pad voltage at the gate terminals of the reference voltage signal-receiving MOS devices, embodiments can reduce/avoid rapidly changing voltage differentials across the reference voltage signal-receiving MOS devices—thereby reducing voltage kickback. By reducing voltage kickback, embodiments can improve reliability and performance for the transceiver. Moreover, because voltage mode cascoded drivers of the present technology can reduce voltage kickback without relying on strong voltage sources, embodiments may be cheaper and achieve smaller footprints than existing voltage kickback-reducing technologies. In addition, by tracking I/O pad voltage at the gate terminals of the reference voltage signal-receiving MOS devices, embodiments can reduce I/O pad capacitance—further improving performance for the transceiver.

In various examples, a transceiver of the present technology may comprise: (1) a first reference voltage kickback reduction circuit electrically connected to a gate terminal of a first reference voltage signal-receiving MOS device such that the first reference voltage kickback reduction circuit supplies a first reference voltage signal to the gate terminal of the first reference voltage signal-receiving MOS device; and (2) a second reference voltage kickback reduction circuit electrically connected to a gate terminal of a second reference voltage signal-receiving MOS device such that the second reference voltage kickback reduction circuit supplies a second reference voltage signal to the gate terminal of the second reference voltage signal-receiving MOS device. The first and second reference voltage signal-receiving MOS devices may be electrically connected to an I/O pad of the transceiver via drain terminals of the first and second reference voltage signal-receiving MOS devices respectively. Operation and design of the first and second reference voltage kickback reduction circuits are described in greater detail in the following paragraphs.

Operation During Receiver vs. Transmitter Modes

The reference voltage kickback reduction circuits of the present technology may operate differently (i.e., supply different reference voltage signals) depending on whether the transceiver is operating in a receiver mode (i.e., when the transceiver is receiving signals from the outside world) vs. a transmitter mode (i.e., when the transceiver is transmitting signals to the outside world). Namely when the transceiver is in a receiver mode, the reference voltage kickback reduction circuits may drive reference voltage signals to dynamically track toggling I/O pad voltage—thereby reducing voltage kickback at the reference voltage signal receiving-MOS devices of a voltage mode cascoded driver segment implemented in the transceiver. By contrast, when the transceiver is in a transmitter mode the reference voltage kickback reduction circuits may supply non-I/O pad voltage-dependent reference voltage signals (i.e., reference signals which do not track toggling I/O pad voltage) in the same/similar manner as conventional transceivers would during a transmitter mode. This operational difference is designed in appreciation of an insight that in general, voltage kickback can be significantly more pronounced (if unchecked) when the transceiver is in the receiver mode. Accordingly, the reference voltage kickback reduction circuits of the present technology are intelligently designed to operate in the same/similar manner as conventional transceivers during transmitter modes. For example, the reference voltage kickback reduction circuits may effectively pass/transmit non-I/O pad-dependent "pre-reference" voltage signals supplied by a separate/upstream "pre-reference" voltage supply source. By contrast, when the transceiver is in a receiver mode and voltage kickback reduction is (more) required, the reference voltage kickback reduction circuits may ensure that reference voltages dynamically track I/O pad voltage—thereby reducing voltage kickback at the reference voltage signal-receiving MOS devices of the voltage mode cascoded driver.

In various implementations, a voltage mode cascoded driver implemented in a transceiver may be a multi-segment voltage mode cascoded driver. During a transmitter mode, some segments of the multi-segment voltage mode cascoded driver may be active while other segments of the multi-segment voltage mode cascoded driver are inactive. In such a scenario, the inactive voltage mode cascoded driver segments may still receive reference voltage signals at the gate terminals of their reference voltage signal-receiving MOS devices. As embodiments of the present technology are designed in appreciation of, in such scenarios the risk of voltage kickback at the reference voltage signal-receiving MOS devices of the inactive voltage mode cascoded driver segments may be the same/similar as when voltage mode cascoded driver segments are active when the transceiver is in a receiver mode. Accordingly, in situations where the transceiver is in a transmitter mode and a voltage mode cascoded driver segment is inactive, reference voltage kickback reduction circuits associated with the inactive voltage mode cascoded driver segment may drive reference voltage signals to dynamically track I/O pad voltage in the same/similar manner as when the voltage mode cascoded driver segment is active and the transceiver is in the receiver mode.

"Tracking" I/O Pad Voltage

As alluded to above, when the transceiver is in a receiver mode (or when the transceiver is in a transmitter mode and certain segments of a voltage mode cascoded driver implemented in the transceiver are inactive), reference voltage kickback reduction circuits of the present technology can drive reference voltage signals to dynamically track I/O pad voltage. Such "tracking" may take different forms depending on application.

For example, as embodiments of the present technology are designed in appreciation of, transceiver implementations using low voltage-tolerant devices may require "partially tracking" I/O pad voltage instead of "fully tracking" I/O pad voltage to maintain reliability. That is, in transceiver implementations using low voltage-tolerance devices, tracking I/O pad voltage all the way to maximum and minimum I/O pad voltages at gate terminals of two reference voltage signal-receiving MOS devices would cause reliability concerns—which can be mitigated through strategic "partial" tracking. For example, in some implementations the first reference voltage kickback reduction circuit can drive the first reference voltage signal to the I/O pad voltage when the I/O pad voltage is maximum. By contrast, when the I/O pad voltage is minimum, the first reference voltage kickback reduction circuit may drive the first reference signal to a first pre-reference voltage (which is less than a supply voltage of the transceiver and greater than a ground voltage). In these implementations, the second reference voltage kickback reduction circuit may drive the second reference voltage signal to a second pre-reference voltage (which is also less than the supply voltage and greater than the ground voltage) when the I/O pad voltage is maximum. By contrast, when the I/O pad voltage is minimum, the second reference voltage kickback reduction circuit may drive the second reference voltage signal to the I/O pad voltage. That is, the first reference voltage kickback reduction circuit can drive the first reference voltage signal to track I/O pad voltage between the maximum I/O pad voltage (which may be approximately the supply voltage of the transceiver) and the first pre-reference voltage (which is less than the supply voltage and greater than the ground voltage). Similarly, the second reference voltage kickback reduction circuit can drive the second reference voltage signal to track I/O pad voltage between the second pre-reference voltage (which is less than the supply voltage and greater than the ground voltage) and the minimum I/O pad voltage (which may be approximately the ground voltage). In this way, voltages at the gate terminals of the first and second reference voltage signal-receiving MOS devices "partially" track I/O pad voltage. As alluded to above, by partially tracking I/O pad voltage instead of fully tracking I/O pad voltage, embodiments can enable transceivers implemented using low voltage-tolerant devices. However, in implementations using higher voltage-tolerant devices, embodiments may fully track I/O voltage. That is, both the first and second reference voltage kickback reduction circuits can drive the first and second reference voltages respectively to track I/O pad voltage between the maximum I/O pad voltage (e.g., approximately the supply voltage of the transceiver) and the minimum I/O pad voltage (e.g., approximately the ground voltage).

In embodiments utilizing the above-described partial tracking, values for the first and second pre-reference voltages may be strategically selected to maintain reliability and improve performance. For example, the values may be selected to maximize source-to-gate voltages for the reference voltage signal-receiving MOS devices without exceeding reliability limits. Alternatively, these values can be set to provide greater margin for reliability by reducing the maximum source-to-gate voltages at the reference voltage signal-receiving MOS devices. In accordance with the insights above, the first and second pre-reference voltages may be set to e.g., 0.45×the supply voltage for the first pre-reference voltage and 0.55×the supply voltage for the second pre-reference voltage.

Reference Voltage Kickback Reduction Circuit Design

As alluded to above, the reference voltage kickback reduction circuits of the present technology can be intelligently designed to (1) operate differently (i.e., supply different reference voltage signals) depending on whether the transceiver a receiver mode vs. a transmitter mode; and (2) partially track I/O pad voltage when the transceiver is in a receiver mode (or when the transceiver is in a transmitter mode and certain segments of a voltage mode cascoded driver implemented in the transceiver are inactive).

As will be described in greater detail below, there are various strategic design features that enable the above-described functionality.

For instance, each of the first and second reference voltage kickback reduction circuits may comprise three sub-circuits responsible for driving reference voltage signals in different scenarios.

For example, the first reference voltage kickback reduction circuit may comprise a first sub-circuit, a second sub-circuit, and a third sub-circuit electrically connected to each other in parallel. The first sub-circuit may drive the first reference voltage signal when the transceiver is in a receiver mode and I/O pad voltage is maximum. The second sub-circuit may drive the first reference voltage signal when the transceiver is in the receiver mode and I/O pad voltage is minimum. The third sub-circuit may drive the first reference voltage signal when the transceiver is in a transmitter mode. In the above-described "partial" tracking implementations, the first sub-circuit may drive the first reference voltage signal to the I/O pad voltage when the voltage transceiver is in a receiver mode and I/O pad voltage is maximum. Relatedly, the second sub-circuit may drive the first reference voltage signal to the first pre-reference voltage when the transceiver is in the receiver mode and I/O pad voltage is minimum.

The second voltage kickback reduction circuit may comprise a fourth sub-circuit, a fifth sub-circuit, and a sixth sub-circuit electrically connected to each other in parallel. The fourth sub-circuit may drive the second reference voltage signal when the transceiver is in a receiver mode and I/O pad voltage is maximum. The fifth sub-circuit may drive the second reference voltage signal when the transceiver is in the receiver mode and I/O pad voltage is minimum. The sixth sub-circuit may drive the second reference voltage signal when the transceiver is in a transmitter mode. In the above-described "partial" tracking implementations, the fourth sub-circuit may drive the second reference voltage signal to the second pre-reference voltage when the transceiver is in a receiver mode and the I/O pad voltage is maximum. Relatedly, the fifth sub-circuit may drive the second reference voltage signal to the I/O pad voltage when the transceiver is in the receiver mode and I/O pad voltage is minimum.

As will be described in greater detail below, embodiments can leverage pull-up and pull-down logic to implement the above-described functionalities.

For example, the first sub-circuit (of the first reference voltage kickback reduction circuit) may comprise a first pull-up transistor and a second pull-up transistor (as used herein a pull-up transistor may be a transistor that is turned on/enabled when voltage at its source terminal is greater than an enable voltage signal supplied at its gate terminal by a pre-determined threshold; the pull-up transistor may be turned off/disabled when voltage at its source terminal is less than or equal to the enable voltage signal supplied at its gate terminal). A source terminal of the first pull-up transistor may be supplied with the I/O pad voltage. A drain terminal of the first pull-up transistor may be electrically connected to a source terminal of the second pull-up transistor. Accordingly, the source terminal of the second pull-up transistor may also be supplied with the I/O pad voltage. A drain terminal of the second pull-up transistor may be electrically connected to the gate terminal of the first reference voltage signal-receiving MOS device (here the first reference voltage signal-receiving MOS device may be a pull-up MOS device). Given this construction, the gate terminals of the first and second pull-up transistors may be strategically supplied with (enable) voltage signals that ensure the first sub-circuit drives the first reference voltage signal to the I/O pad voltage when the transceiver is in the receiver mode and I/O pad voltage is maximum. By contrast, the first sub-circuit may not drive the reference voltage signal when the transceiver is in the receiver mode and I/O pad voltage is minimum and/or when the transceiver is in the transmitter mode. For example, when the transceiver is in the receiver mode the gate terminals of the first and second pull-up transistors may be supplied with the first pre-reference voltage. As described above, the first pre-reference voltage will be less than the supply voltage of the transceiver and greater than the ground voltage. Accordingly, when I/O pad voltage is maximum (i.e., greater than the first pre-reference voltage supplied at the gate terminals of the first and second pull-up transistors), the first and second pull-up transistors may be enabled—thereby ensuring that the (maximum) I/O pad voltage supplied at the source terminal of the first pull-up transistor is effectively translated to the gate terminal of the first reference voltage signal-receiving MOS device. By contrast, when the I/O pad voltage is minimum (i.e., less than the first pre-reference voltage supplied at the gate terminals of the first and second pull-up transistors), the first and second pull-up transistors may be disabled—thereby effectively de-activating the first sub-circuit from driving the first reference voltage signal. Relatedly, when the transceiver is in a transmitter mode the voltage supplied to the gate terminal of the second pull-up transistor may be the supply voltage. Here, the supply voltage may always be greater than or equal to the (contemporaneous) I/O pad voltage supplied at the source terminals of the first and second pull-up transistors. This ensures that the second pull-up transistor is always disabled in transmitter modes—thereby effectively de-activating the first sub-circuit from driving the first reference voltage signal when the transceiver is in a transmitter mode.

The second sub-circuit (of the first voltage kickback reduction circuit) may be structured similarly to the first sub-circuit. For example, the second sub-circuit may comprise a third pull-up transistor and a fourth pull-up transistor. A source terminal of the third pull-up transistor may be supplied with the first pre-reference voltage. A drain terminal of the third pull-up transistor may be electrically connected to a source terminal of the fourth pull-up transistor. Accordingly, the first pre-reference voltage may effectively be supplied at the source terminal of the fourth pull-up transistor as well. A drain terminal of the fourth pull-up transistor may be electrically connected to the gate terminal of the first reference voltage signal-receiving MOS device. Given this construction, gate terminals of the third and fourth pull-up transistors may be strategically supplied with (enable) voltage signals that ensure the second sub-circuit drives the first reference voltage to the first pre-reference voltage when the voltage mode cascoded driver segment is in the receiver mode and I/O pad voltage is minimum. By contrast, the second sub-circuit may not drive the reference voltage signal when the transceiver is in the receiver mode and I/O pad voltage is maximum and/or when the transceiver is in the transmitter mode. For example, when the transceiver is in the receiver mode the gate terminal of the third pull-up transistor may be supplied with the ground voltage (which is less than the first pre-reference voltage supplied at the source terminal of the third pull-up transistor) and the gate terminal of the fourth pull-up transistor may be supplied with the (contemporaneous) I/O pad voltage (which may be greater than or less than the first pre-reference voltage supplied at the source terminal of the third pull-up transistor depending on whether the I/O pad voltage is minimum or maximum). Accordingly, when the I/O pad voltage is minimum (i.e., less than the first pre-reference voltage supplied at the source terminal of the third pull-up transistor), the third and fourth pull-up transistors may be enabled—thereby ensuring that the first pre-reference voltage supplied at the source terminal of the third pull-up transistor is effectively translated to the gate terminal of the first reference voltage signal-receiving MOS device. By contrast, when the I/O pad voltage is maximum (i.e., greater than the first pre-reference voltage supplied at source terminal of the third pull-up transistor), the fourth pull-up transistor may be disabled—thereby effectively de-activating the second sub-circuit from driving the first reference voltage signal. Relatedly, when the transceiver is in a transmitter mode the voltage supplied to the gate terminal of the third pull-up transistor may be the second pre-reference voltage. Here, the second pre-reference voltage may be set to be greater than or equal to the first pre-reference voltage supplied at the supply of the third pull-up transistor. Such setting can ensure that the third pull-up transistor is always disabled in transmitter modes—thereby effectively de-activating the second sub-circuit from driving the first reference voltage signal when the voltage mode cascoded driver segment is in a transmitter mode.

The third sub-circuit (of the first voltage kickback reduction circuit) may be structured differently than the first and second sub-circuits. For example, the third sub-circuit may comprise a pull-down transistor (as used herein a pull-down transistor may be a transistor that is turned on/enabled when voltage at its source terminal is less than an enable voltage signal supplied at its gate terminal by a pre-determined threshold; the pull-down transistor may be turned off/disabled when voltage at its source terminal is greater than or equal to the enable voltage signal supplied at its gate terminal). A source terminal of the pull-down transistor may be supplied with the first pre-reference voltage. A drain terminal of the pull-down transistor may be electrically connected to the gate terminal of the first reference voltage signal-receiving MOS device. Given this construction, the gate terminal of the pull-down transistor may be strategically supplied with (enable) voltage signals that ensure the third sub-circuit drives the first reference voltage to the first pre-reference voltage when the transceiver is in the transmitter mode. By contrast, the third sub-circuit may not drive the reference voltage signal when the transceiver is in the receiver mode. For example, when the transceiver is in the transmitter mode the voltage supplied at the gate terminal of the pull-down transistor may be the supply voltage (which is greater than the first pre-reference voltage supplied at the source terminal of the pull-down transistor) such that the pull-down transistor is always enabled in the transmitter mode—thereby ensuring that the first pre-reference voltage supplied at the source terminal of the pull-down transistor is effectively translated to the gate terminal of the first reference voltage signal-receiving MOS device. By contrast, when the transceiver is in the receiver mode the voltage supplied at the gate terminal of the pull-down transistor may be the first pre-reference voltage (which is equivalent to the first pre-reference voltage supplied at the supply of the pull-down transistor) such that the pull-down transistor is always disabled in the transmitter mode—thereby effectively de-activating the third sub-circuit from driving the first reference voltage signal when the transceiver is in the receiver mode.

Here, the fourth, fifth, and sixth sub-circuits of the second voltage kickback reduction circuit may be structured similarly to the first, second, and third sub-circuits of the first voltage kickback reduction circuit respectively. However, where the first and second sub-circuits utilized pull-up logic/pull-up transistors, the fourth and fifth sub-circuits may utilize pull-down logic/pull-down transistors. Similarly, where the third sub-circuit utilized pull-down logic/a pull-down transistor, the sixth sub-circuit may utilize pull-up logic/a pull-up transistor. Relatedly, the second reference voltage signal-receiving MOS device may be a pull-down MOS device.

Advantages of the Present Technology

As alluded to above, transceivers of the present technology provide numerous advantages over existing technologies. For example, by reducing voltage kickback at the reference voltage signal-receiving MOS devices of a voltage mode cascoded driver, embodiments can maintain reliability and improve performance for the transceiver in which the voltage mode cascoded driver is implemented. Relatedly, embodiments can reduce capacitance of the I/O pad of the transceiver—thereby improving performance for the transceiver. As alluded to above, embodiments can achieve these advantages without relying on strong voltage sources, meaning that embodiments may be cheaper and achieve smaller footprints than existing voltage kickback-reduction technologies (here, the reduced I/O pad capacitance realized by the present technology would generally not be achieved by simply using stronger voltage sources for the reference voltage signals either). Moreover, by improving transceivers implemented with voltage mode cascoded drivers, embodiments can enhance the advantages that existing voltage mode cascoded drivers already provide over other types of voltage mode drivers (e.g., reduced costs and footprints associated with the voltage mode cascoded drivers enabling transceiver implementations with low voltage tolerant devices).

FIGS. 1 to 4H depict an example memory system that can be used to implement the technology disclosed herein. Of course, this is just an example implementation and the disclosed technology is not limited to implementing the present voltage mode cascoded driver in a memory system. FIG. 1 is a schematic block diagram illustrating a memory system 100. The memory system 100 includes a memory device 200 (also referred to herein as a storage device), a host device 106, at least one host device 112, and a computer network 114.

The host device 106 may be a computing device (e.g., laptop, desktop, smartphone, tablet, digital camera, wearable smart device, and so on) that includes one or more processors and readable storage devices (such as, but not limited to, RAM, ROM, flash memory, hard disk drive, solid state memory) that store processor readable code (also referred to herein as instructions or software) for programming storage controller 102 to perform the methods described herein. The host device 106 may also include additional system memory, one or more input/output interfaces, and/or one or more input/output devices in communication with the one or more processors, as well as other components well known in the art.

The memory system 100 includes at least one memory device 200, comprising the storage controller 102 and a plurality of memory dies 104. "Storage controller" refers to any hardware, device, component, element, or circuit configured to manage data operations on non-volatile memory media, and may comprise one or more processors, programmable processors (e.g., FPGAs), ASICs, micro-controllers, or the like. In some embodiments, the storage controller is configured to store data on and/or read data from non-volatile memory media, to transfer data to/from the non-volatile memory device(s), and so on.

In some embodiments, the memory system 100 may include two or more memory devices. Each memory device 200 may include a plurality of memory dies 104, such as flash memory, nano random access memory ("nano RAM or NRAM"), magneto-resistive RAM ("MRAM"), dynamic RAM ("DRAM"), phase change RAM ("PRAM"), etc. The data memory device 200 may also include other types of non-volatile and/or volatile data storage, such as dynamic RAM ("DRAM"), static RAM ("SRAM"), magnetic data storage, optical data storage, and/or other data storage technologies.

The memory device 200 may be a component within a host device 106 as depicted in FIG. 1, and may be connected using a system bus, such as a peripheral component interconnect express ("PCI-e") bus, a Serial Advanced Technology Attachment ("serial ATA") bus, or the like. In another embodiment, the memory device 200 may be external to the host device 106 and is connected via a wired connection, such as, but not limited to, a universal serial bus ("USB") connection, an Institute of Electrical and Electronics Engineers ("IEEE") 1394 bus ("FireWire"), or the like. In other embodiments, the memory device 200 may be connected to the host device 106 using a peripheral component interconnect ("PCI") express bus using external electrical or optical bus extension or bus networking solution such as Infiniband or PCI Express Advanced Switching ("PCIe-AS"), or the like.

In various embodiments, the memory device 200 may be in the form of a dual-inline memory die ("DIMM"), a daughter card, or a micro-module. In another embodiment, the memory device 200 may be a component within a rack-mounted blade. In another embodiment, the memory device 200 may be contained within a package that is integrated directly onto a higher level assembly (e.g., mother-board, laptop, graphics processor, etc.). In another embodiment, individual components comprising the memory device 200 may be integrated directly onto a higher level assembly without intermediate packaging.

In some embodiments, instead of directly connected to the host device 106 via a wired connection, the data memory device 200 may be connected to the host device 106 over a wireless connection. For example, the data memory device 200 may include a storage area network ("SAN") storage device, a network attached storage ("NAS") device, a network share, or the like. In some embodiments, the memory system 100 may be connected to the host via a data network, such as the Internet, a wide area network ("WAN"), a metropolitan area network ("MAN"), a local area network ("LAN"), a token ring, a wireless network, a fiber channel network, a SAN, a NAS, ESCON, or the like, or any combination of networks. A data network may also include a network from the IEEE 802 family of network technologies, such Ethernet, token ring, Wi-Fi, Wi-Max, and the like. A data network may include servers, switches, routers, cabling, radios, and other equipment used to facilitate networking between the host device 106 and the data memory device 200.

The memory system 100 includes at least one host device 106 connected to the memory device 200. Multiple host devices may be used and may comprise a host, a server, a storage controller of a storage area network ("SAN"), a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. "Computer" refers to any computing device. Examples of a computer include, but are not limited to, a personal computer, a laptop, a tablet, a desktop, a server, a main frame, a supercomputer, a computing node, a virtual computer, a hand held device, a smart phone, a cell phone, a system on a chip, a single chip computer, and the like. In another embodiment, a host device 106 may be a client and the memory device 200 may operate autonomously to service data requests sent from the host device 106. In this embodiment, the host device 106 and memory device 200 may be connected using a computer network, system bus, DAS or other communication means suitable for connection between a computer and an autonomous memory device 200.

The illustrative example shown in FIG. 1, the memory system 100 includes a user application 108 in communication with a storage client 110 as part of the host device 106. "Application" refers to any software that is executed on a device above a level of the operating system. An application will typically be loaded by the operating system for execution and will make function calls to the operating system for lower-level services. An application often has a user interface, but this is not always the case. Therefore, the term 'application' includes background processes that execute at a higher level than the operating system.

"Operating system" refers to logic, typically software, that supports a device's basic functions, such as scheduling tasks, managing files, executing applications, and interacting with peripheral devices. In normal parlance, an application is said to execute "above" the operating system, meaning that the operating system is necessary in order to load and execute the application and the application relies on modules of the operating system in most cases, not vice-versa. The operating system also typically intermediates between applications and drivers. Drivers are said to execute "below" the operating system because they intermediate between the operating system and hardware components or peripheral devices.

In various embodiments, the user application 108 may be a software application operating on or in conjunction with the storage client 110. The storage client 110 manages files and data and utilizes the functions and features of the storage controller 102 and associated memory dies 104. "File" refers to a unitary data structure for storing, retrieving, and communicating data and/or instructions. A file is distinguished from other types of packaging by having associated management metadata utilized by the operating system to identify, characterize, and access the file. Representative examples of storage clients include, but are not limited to, a server, a file system, an operating system, a database management system ("DBMS"), a volume manager, and the like. The storage client 110 may be in communication with the storage controller 102 within the memory device 200.

In various embodiments, the memory system 100 may include one or more clients connected to one or more host device 112 through one or more computer networks 114. A host device 112 may be a host, a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. The computer network 114 may include the Internet, a wide area network ("WAN"), a metropolitan area network ("MAN"), a local area network ("LAN"), a token ring, a wireless network, a fiber channel network, a SAN, network attached storage ("NAS"), ESCON, or the like, or any combination of networks. The computer network 114 may also include a network from the IEEE 802 family of network technologies, such Ethernet, token ring, Wi-Fi, WiMax, and the like.

The computer network 114 may include servers, switches, routers, cabling, radios, and other equipment used to facilitate networking the host device 106 or host devices and host devices 112 or clients. In some embodiments, the memory system 100 may include one or more host devices 112 and host device 106 that communicate as peers over a computer network 114. In other embodiments, the memory system 100 may include multiple memory devices 200 that communicate as peers over a computer network 114. One of skill in the art will recognize other computer networks comprising one or more computer networks and related equipment with single or redundant connection(s) between one or more clients or other computer with one or more memory devices 200 or one or more memory devices 200 connected to one or more host devices. In one embodiment, the memory system 100 may include two or more memory devices 200 connected through the computer network 114 to a host device 112 without a host device 106.

In some embodiments, the storage client 110 communicates with the storage controller 102 through a host device interface comprising an Input/Output (I/O) interface. "Interface" refers to a protocol and associated circuits, circuitry, components, devices, systems, sub-systems, and the like that enable one device, component, or apparatus to interact and/or communicate with another device, component, or apparatus. For example, the memory device 200 may support the ATA interface standard, the ATA Packet Interface ("ATAPI") standard, the small computer system interface ("SCSI") standard, and/or the Fibre Channel standard which are maintained by the InterNational Committee for Information Technology Standards ("INCITS").

In certain embodiments, the storage media of a memory device is divided into volumes or partitions. Each volume or partition may include a plurality of sectors. A sector of data is typically 512 bytes, corresponding to the size of a sector in magnetic disk drives.

In various embodiments number of sectors form a block (or data block), anywhere from 8 sectors, which is 4 KB, for example, up to 32, 64, 128 or more sectors. Different sized blocks and sectors can also be used. In certain storage systems, such as those interfacing with the Windows® operating systems, the data blocks may be referred to as clusters. In other storage systems, such as those interfacing with UNIX, Linux, or similar operating systems, the data blocks may be referred to simply as blocks. A block or data block or cluster represents a smallest physical amount of storage space on the storage media that is managed by a storage manager, such as a storage controller, storage system, storage unit, storage device, or the like.

In some embodiments, the storage controller 102 may be configured to store data on one or more asymmetric, write-once storage media, such as solid-state storage memory cells within the memory die(s) 104. As used herein, a "write once" storage media refers to storage media that is reinitialized (e.g., erased) each time new data is written or programmed thereon. As used herein, an "asymmetric" storage media refers to a storage media having different latencies for different storage operations. Many types of solid-state storage media (e.g., memory die) are asymmetric; for example, a read operation may be much faster than a write/program operation, and a write/program operation may be much faster than an erase operation (e.g., reading the storage media may be hundreds of times faster than erasing, and tens of times faster than programming the storage media).

Management of a data block by a storage manager may include specifically addressing a particular data block for a read operation, write operation, or maintenance operation. A block storage device may associate n blocks available for user data storage across the storage media with a logical address, numbered from 0 to n. In certain block storage devices, the logical addresses may range from 0 to n per volume or partition. In conventional block storage devices, a logical address, also referred to as a logical block address (LBA), maps directly to a particular data block on physical storage media. In conventional block storage devices, each data block maps to a particular set of physical sectors on the physical storage media.

However, certain storage devices need not directly or necessarily associate logical addresses with particular physical data blocks. These storage devices may emulate a conventional block storage interface to maintain compatibility with a block storage client 110.

In some embodiments, the storage controller 102 may provide a block I/O emulation layer, which serves as a block device interface, or API. In these embodiments, the storage client 110 communicates with the storage device through this block device interface. The block I/O emulation layer may receive commands and logical addresses from the storage client 110 in accordance with this block device interface. As a result, the block I/O emulation layer may provide the storage device compatibility with a block storage client 110.

In some embodiments, a storage client 110 communicates with the storage controller 102 through a host device interface comprising a direct interface. In these embodiments, the memory device 200 directly exchanges information specific to non-volatile storage devices. Memory device 200 using direct interface may store data in the memory die(s) 104 using a variety of organizational constructs including, but not limited to, blocks, sectors, pages, logical blocks, logical pages, erase blocks, logical erase blocks, ECC codewords, logical ECC codewords, or in any other format or structure advantageous to the technical characteristics of the memory die(s) 104.

The storage controller 102 may receive a logical address and a command from the storage client 110 and perform the corresponding operation in relation to the memory die(s) 104. The storage controller 102 may support block I/O emulation, a direct interface, or both.

Figure 2A:
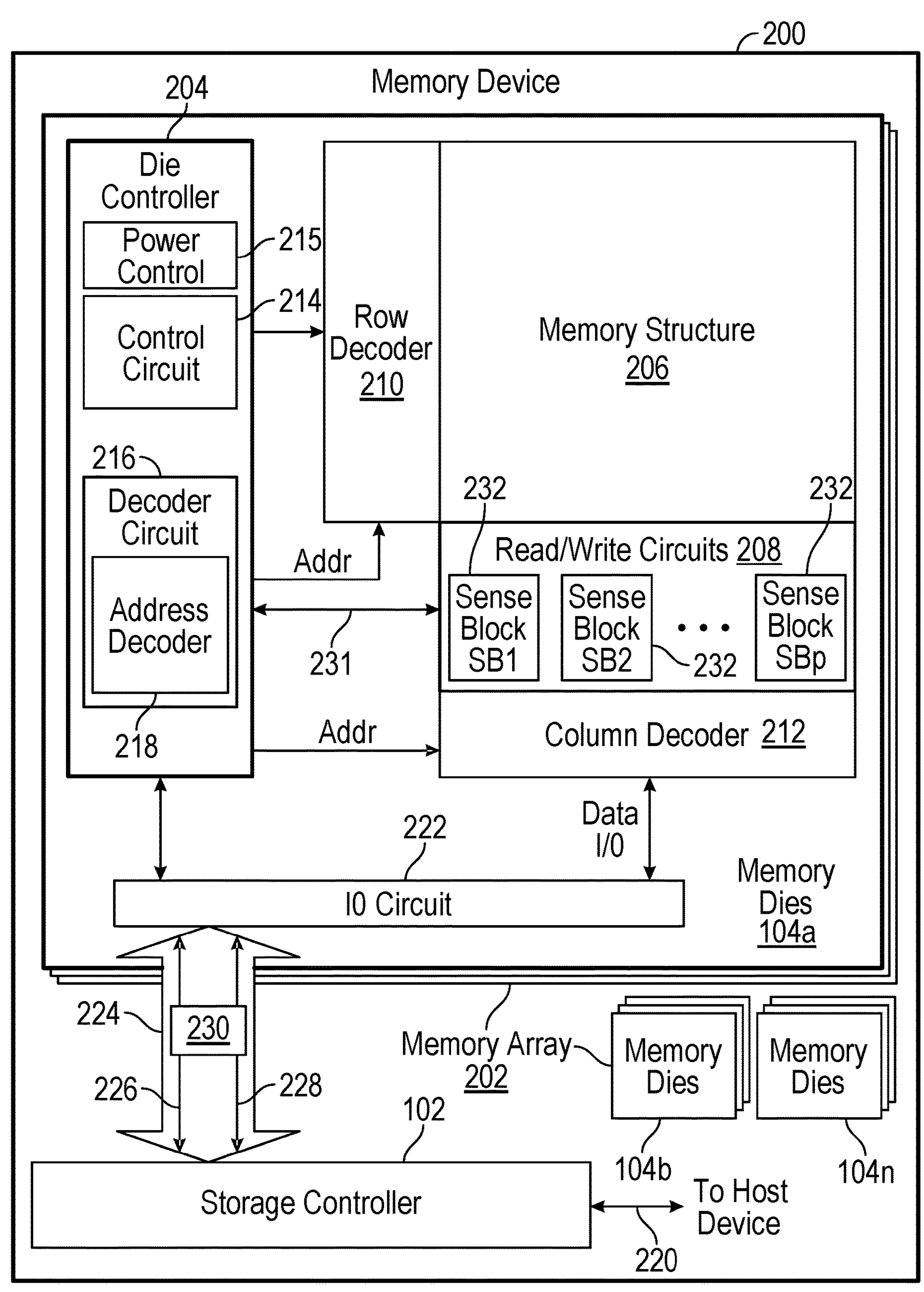
FIG. 2A is a block diagram of an example memory device, in connection with which, example embodiments of the disclosed technology can be implemented.

FIG. 2A is a functional block diagram of an example memory device 200. The components depicted in FIG. 2A are electrical circuits.

The memory device 200 may include a storage controller 102 and a memory array 202 comprised of a number of memory dies 104*a-n*, the storage controller 102 and memory dies 104*a-n* being effectively as described with regard to FIG. 1. Each memory die 104*a-n* can be a complete memory die or a partial memory die and may include a die controller 204, at least one memory structure 206, and read/write circuits 208. The following description will be made with reference to memory die 104*a* as an example of memory dies 104*a-n*, where each memory die may include same or similar components and function in the same or similar way. Thus, while reference herein is made to memory die 104*a*, the same description may be applied equally to memory dies 104*b-n*.

In this context, "memory array" refers to a set of memory cells (also referred to as storage cells) organized into an array structure having rows and columns. A memory array is addressable using a row identifier and a column identifier, each represented as part of an address, such as a column or row address. A non-volatile memory array is a memory array having memory cells configured such that a characteristic (e.g., threshold voltage level, resistance level, conductivity, etc.) of the memory cell used to represent stored data remains a property of the memory cell without a requirement for using a power source to maintain the characteristic.

Those of skill in the art recognize that a memory array may comprise the set of memory cells within a plane, the set of memory cells within a memory die, the set of memory cells within a set of planes, the set of memory cells within a set of memory die, the set of memory cells within a memory package, the set of memory cells within a set of memory packages, or with other known memory cell set architectures and configurations.

A memory array may include a set of memory cells at a number of levels of organization within a storage or memory system. In one embodiment, memory cells within a plane may be organized into a memory array. In one embodiment, memory cells within a plurality of planes of a memory die may be organized into a memory array. In one embodiment, memory cells within a plurality of memory dies of a memory device may be organized into a memory array. In one embodiment, memory cells within a plurality of memory devices of a storage system may be organized into a memory array.

In the context of FIG. 2A, memory structure 206 may be addressable by wordlines via a row decoder 210 and by bitlines via a column decoder 212. The read/write circuits 208 include multiple sense blocks 232 including SB1, SB2, . . . , SBp (sensing circuitry) and allow a pages of memory cells to be read or programmed in parallel. Also, many strings of memory cells can be erased in parallel.

"Circuitry", as used herein, refers to electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes or devices described herein, or a microprocessor configured by a computer program which at least partially carries out processes or devices described herein), circuitry forming a memory device (e.g., forms of random access memory), or circuitry forming a communications device (e.g., a modem, communications switch, or optical-electrical equipment).

A physical page may include memory cells along a row of the memory array for a single plane or for a single memory die. In some embodiments, each memory die 104*a-n* includes a memory array made up of two equal sized planes. A plane is a division of the memory array that permits certain storage operations to be performed on both places using certain physical row addresses and certain physical column addresses. In one embodiment, a physical page of one plane of a memory die includes four data blocks (e.g., 16 KB). In one embodiment, a physical page (also called a "die page") of a memory die includes two planes each having four data blocks (e.g., 32 KB).

The memory structure 206 can be two-dimensional (2D-laid out in a single fabrication plane) or three-dimensional (3D-laid out in multiple fabrication planes). The non-volatile memory array 202 may comprise one or more arrays of memory cells including a 3D array. In one embodiment, the non-volatile memory array 202 may comprise a monolithic three-dimensional memory structure (3D array) in which multiple memory levels are formed above (and not in) a single substrate, such as a wafer, with no intervening substrates. The non-volatile memory array 202 may comprise any type of non-volatile memory that is monolithically formed in one or more physical levels of arrays of memory cells having an active area disposed above a silicon substrate. The non-volatile memory array 202 may be in a non-volatile solid state drive having circuitry associated with the operation of the memory cells, whether the associated circuitry is above or within the substrate. Word lines may comprise sections of the layers containing memory cells, disposed in layers above the substrate. Multiple word lines may be formed on single layer by means of trenches or other non-conductive isolating features.

The die controller 204 (also referred to as a die control circuitry) cooperates with the read/write circuits 208 to perform memory operations on memory cells of the non-volatile memory array 202 and includes a control circuit 214 (also referred to as a state machine), a decoder circuit 216 that may incorporate an address decoder 218, and a power control circuit 215. The control circuit 214 provides chip-level control of memory operations on the memory die 104*a*. The die controller 204 may also include power control circuit 215 that controls the power and voltages supplied to the wordlines, bitlines, and select lines during memory operations. The power control circuit 215 may include voltage circuitry, in one embodiment. Power control circuit 215 may include charge pumps for creating voltages. The sense blocks 232 include bitline drivers. The power control circuit 215 executes under control of the control circuit 214, in various embodiments.

"Die controller" refers to a set of circuits, circuitry, logic, or components configured to manage the operation of a die. In one embodiment, the die controller is an integrated circuit. In another embodiment, the die controller is a combination of discrete components. In another embodiment, the die controller is a combination of one or more integrated circuits and one or more discrete components. In one example, the die controller may include buffers such as registers, read-only memory (ROM) fuses and other storage devices for storing default values such as base voltages and other parameters.

"Control circuit" refers to a device, component, element, module, system, sub-system, circuitry, logic, hardware, or circuit configured and/or operational to manage one or more other circuits. For example, a controller programmed by firmware to perform the functions described herein is one example of a control circuit. A control circuit can include a processor, a PGA (Programmable Gate Array), an FPGA (Field Programmable Gate Array), an ASIC (Application Specific Integrated Circuit), or another type of integrated circuit or circuit more generally. In certain embodiments, a control circuit is responsible to ensure that primary features and functionality of a larger circuit, die, or chip, that includes the control circuit, perform properly. The address decoder 218 provides an address interface between that used by the host or a storage controller 102 to the hardware address used by the row decoder 210 and column decoder 212. Power control circuit 215 controls the power and voltages supplied to the wordlines, bitlines, and select lines during memory operations. The power control circuit 215 includes voltage circuitry, in one embodiment. The power control circuit 215 executes under control of the control circuit 214, in one embodiment.

Commands and data are transferred between the host device and storage controller 102 via a data bus 220, and between the storage controller 102 and an input/output (IO) circuit 222 on each of the memory dies 104*a-n* via a memory interface 224. The memory interface 224 may be a type of communication bus, comprising a control bus 226 and a data bus 228 (also referred to herein as I/O data bus), over which fixed length command sequences 230 may be transmitted. The command bus may comprise, for example but not limited to, a command bus over which commands are transmitted to the memory die 104*a* and an address bus over which addresses are transmitted to the memory die 104*a*. "Memory interface" refers to an interface between a memory die and a storage controller. Examples of memory interface that may be used in connection with the disclosed solution include Toggle Mode ("TM"), Toggle NAND 2.0, Open NAND Flash Interface (ONFI) NAND, a vendor specific interface, a proprietary interface, and the like. In the depicted embodiment, the memory interface 224 is a proprietary interface configured to transfer fixed length command sequences 230.

"Communication bus" refers to hardware, software, firmware, logic, control line(s), and one or more associated communication protocols, that are configured to enable a sender to send data to a receiver. A communication bus may include a data bus and/or a control bus.

"Firmware" refers to logic embodied as processor-executable instructions stored on volatile memory media and/or non-volatile memory media.

"Data bus" refers to a communication bus used to exchange one or more of data bits between two electronic circuits, components, chips, die, and/or systems. A data bus may include one or more signal/control lines. A sender, such as a controller, may send data signals over one or more control lines of the data bus in parallel (operating as a parallel bus) or in series (operating as a serial bus). A data bus may include the hardware, control line(s), software, firmware, logic, and/or the communication protocol used to operate the data bus.

Examples data buses may include 8-bit buses having 8 control lines, 16-bit buses having 16 control lines, 32-bit buses having 32 control lines, 64-bit buses having 64 control lines, and the like. Control lines may carry exclusively communication data, exclusively address data, exclusively control data, or any combination of these types of data.

In various embodiments, a single data bus may be shared by a plurality of components, such as memory die. When multiple chips or memory dies share a data bus, that data may be accessed or transferred by a single memory die or by all the memory dies in parallel based on signals on a chip enable control line.

A data bus may operate, and be configured, according to an industry standard or based on a proprietary protocol and design. Multiple control line of a data bus may be used in parallel and may latch data into latches of a destination component according to a clocking signal, data strobe signal ("DQS"), or clock, such as strobe signal. In certain embodiments, a control bus and a data bus together may form a communication bus between a sender and a receiver.

"Control bus" refers to a communication bus used to exchange one or more of data, address information, control signals, clock signals, and the like, between two electronic circuits, components, chips, die, and/or systems. A control bus may comprise 1 or more control lines, be configured to operate as a parallel bus or a serial bus, and may include the hardware, control line(s), software, firmware, logic, and/or the communication protocol used to operate the control bus.

Typically, a control bus sends control signals to one or more memory die to manage operations on the memory die.

In certain embodiments, the control bus sends control signals such as, for example, one or more of, a write enable ("WEn"), chip enable ("CEn"), read enable ("REn"), a clock signal, strobe signal ("DQS"), command latch enable ("CLE"), address latch enable ("ALE"), and the like.

In certain embodiments, the control bus may not transfer data relating to a storage operation, such as write data or read data. Instead, write data and read data may be transferred over a data bus. In certain embodiments, a control bus and a data bus together may form a communication bus between a sender and a receiver.

The address decoder 218 of the die controller 204 may be coupled to the memory structure 206 in order to identify a location within the memory structure 206 for a storage command. In particular, the address decoder 218 determines a row identifier and a column identifier which together identifies the location within the memory structure 206 that applies to a storage command associated with a command address. The storage command and command address are received in a fixed length command sequence.

The input/output (IO) circuit 222 may be coupled, through the memory interface 224 and to the memory interface circuit 234 of the storage controller 102, to a data bus 220 in order to receive a fixed length command sequence 230. The decoder circuit 216 of the die controller 204 may be coupled through the input/output (IO) circuit 222 to a control bus 226 to receive fixed length command sequences 230 over the data bus 220 via memory interface circuit 234. In one embodiment, the data bus 220 may comprise eight control lines, each configured to transfer one bit in parallel across the data bus 220.

The decoder circuit 216 may decode a command address and a storage command from a fixed length command sequence. The control circuit 214 of the die controller 204 may be coupled to the input/output (IO) circuit 222 and decoder circuit 216 and may generate control signals 231 to execute storage commands decoded by the decoder circuit 216. "Control signal" refers to an electrical signal (wired or wireless) sent from one device, component, manager, or controller to another device, component, manager, or controller configured to act in response to the control signal.

The read/write circuits 208 may be coupled to the non-volatile memory array 202 and the control circuit 214 in order to transfer data between the non-volatile memory array 202 and the input/output (IO) circuit 222 in response to the storage commands.

In some implementations, some of the components can be combined. In various designs, one or more of the components (alone or in combination), other than memory structure 206, can be thought of as at least one control circuit or storage controller which is configured to perform the techniques described herein. For example, a control circuit may include any one of, or a combination of, storage controller 102, die controller 204, read/write circuits 208, column decoder 212, control circuit 214, decoder circuit 216, address decoder 218, sense blocks SB1, SB2, . . . , SBp, and so forth.

Associated circuitry may be required for operation of the memory cells and for communication with the memory cells. As non-limiting examples, memory devices may have circuitry used for controlling and driving memory cells to accomplish functions such as programming and reading. This associated circuitry may be on the same substrate as the memory cells and/or on a separate substrate. For example, a storage controller for memory read-write operations may be located on a separate storage controller chip and/or on the same substrate as the memory cells.

In various embodiments, memory structure 206 comprises a three-dimensional (3D) memory array of non-volatile memory cells in which multiple memory levels are formed above a single substrate, such as a wafer. The memory structure may comprise any type of non-volatile memory monolithically formed in one or more physical levels of arrays of memory cells having an active area disposed above a silicon (or other type of) substrate. In one example, the non-volatile memory cells comprise vertical NAND strings with charge-trapping material. In another embodiment, memory structure 206 comprises a two-dimensional (2D) memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 206 is not limited to the examples above. Many different types of memory array architectures or memory technologies can be used to form memory structure 206. No particular non-volatile memory technology is required for purposes of the new claimed embodiments proposed herein. Other examples of suitable technologies for memory cells of the memory structure 206 include resistive random access memory (ReRAM) memories, magnetoresistive RAM (MRAM) memory (e.g., MRAM, Spin Transfer Torque MRAM, Spin Orbit Torque MRAM), phase change memory (PCM), and the like. Examples of suitable technologies for memory cell architectures of the memory structure 206 include 2D arrays, 3D arrays, cross-point arrays, stacked 2D arrays, vertical bitline arrays, and the like.

Cross point memory-one example of a ReRAM or PCM RAM—includes reversible resistance-switching elements arranged in cross point arrays accessed by X lines and Y lines (e.g., wordlines and bitlines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one that is relatively inert (e.g., tungsten) and the other of which is electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

MRAM stores data within magnetic storage elements. The magnetic storage elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device can be built from a grid of such memory cells. In one embodiment for programming, each memory cell lies between a pair of write lines arranged at right angles to each other, parallel to the cell, one above and one below the cell. When current is passed through them, an induced magnetic field is created.

PCM exploits the unique behavior of chalcogenide glass. One embodiment uses a GeTe—Sb2Te3 super lattice to achieve non-thermal phase changes by simply changing the coordination state of the Germanium atoms with a laser pulse (or light pulse from another source). As such, the programming doses are laser pulses. The memory cells can be inhibited by blocking the memory cells from receiving the light. Note that the use of "pulse" in this document does not require a square pulse, but also includes a continuous (or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 2B:
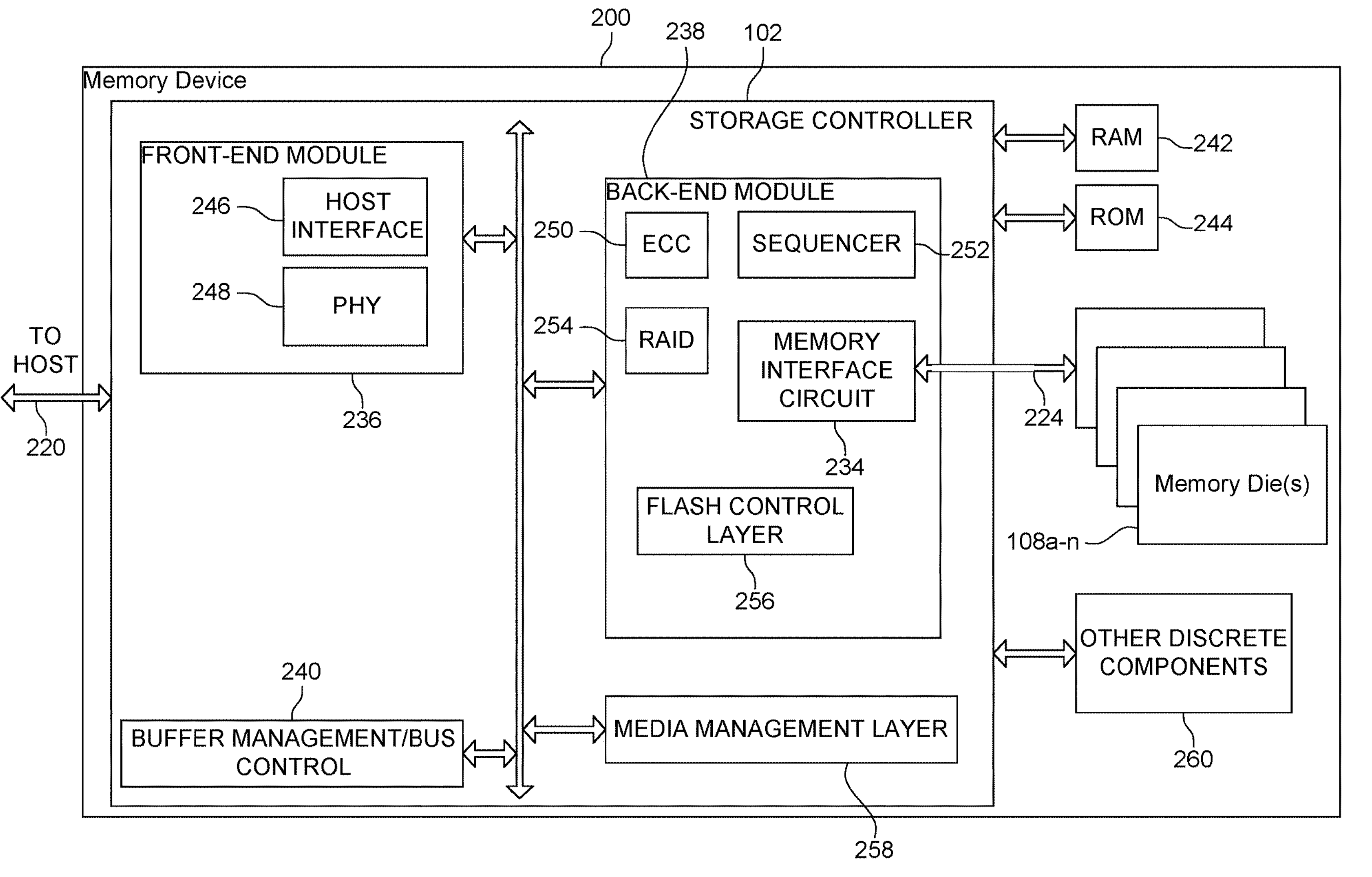
FIG. 2B is a block diagram of an example memory device that depicts more details of an example controller, in connection with which, example embodiments of the disclosed technology can be implemented.

FIG. 2B is a block diagram of example memory device 200 that depicts more details of one embodiment of controller 102. While the storage controller 102 in the embodiment of FIG. 2B is a flash memory controller, it should be appreciated that memory device 200 is not limited to flash memory. Thus, the storage controller 102 is not limited to the particular example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In an example operation, when a host needs to read data from or write data to the flash memory, it will communicate with the flash memory controller. If the host provides a logical address to which data is to be read/written, the flash memory controller can convert the logical address received from the host to a physical address in the flash memory. Alternatively, the host itself can provide the physical address. The flash memory controller can also perform various memory management functions including, but not limited to, wear leveling (distributing writes to avoid wearing out specific blocks of memory that would otherwise be repeatedly written to) and garbage collection (after a block is full, moving only the valid pages of data to a new block, so that the full block can be erased and reused).

The interface between storage controller 102 and memory dies 104 may be any suitable flash interface, such as Toggle Mode 200, 400, or 800. In one embodiment, memory device 200 may be a card-based system, such as a secure digital (SD) or a micro secure digital (micro-SD) card. In an alternate embodiment, memory system 100 may be part of an embedded memory system. For example, the flash memory may be embedded within the host. In other examples, memory device 200 can be a solid state drive (SSD).

In some embodiments, memory device 200 includes a single channel between storage controller 102 and memory die 108. However, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if only a single channel is shown in the drawings.

As depicted in FIG. 2B, storage controller 102 includes a front-end module 236 that interfaces with a host, a back-end module 238 that interfaces with the memory die 108, and various other modules that perform functions which will now be described in detail. The components of storage controller 102 depicted in FIG. 2B may take various forms including, without limitation, a packaged functional hardware unit (e.g., an electrical circuit) designed for use with other components, a portion of a program code (e.g., software or firmware) executable by a (micro) processor or processing circuitry that usually performs a particular function of related functions, a self-contained hardware or software component that interfaces with a larger system, or the like. For example, each module may include an ASIC, an FPGA, a circuit, a digital logic circuit, an analog circuit, a combination of discrete circuits, gates, or any other type of hardware or combination thereof. Alternatively or additionally, each module may include software stored in a processor readable device (e.g., memory) to program a processor to enable storage controller 102 to perform the functions described herein.

Referring again to modules of the storage controller 102, a buffer manager/bus control 240 manages buffers in RAM 242 and controls the internal bus arbitration of storage controller 102. ROM 244 stores system boot code. Although illustrated in FIG. 2B as located separately from the storage controller 102, in other embodiments, one or both of RAM 242 and ROM 244 may be located within the storage controller 102. In yet other embodiments, portions of RAM 242 and ROM 244 may be located within the storage controller 102, while other portions may be located outside the controller. Further, in some implementations, the storage controller 102, RAM 242, and ROM 244 may be located on separate semiconductor dies.

Front-end module 236 includes a host interface 246 and a physical layer interface (PHY) 248 that provide the electrical host interface via bus 220 with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back-end module 238 includes an error correction code (ECC) engine 250 that encodes the data bytes received from the host, and decodes and error corrects the data bytes read from the memory dies 104. A command sequencer 252 generates command sequences, such as program and erase command sequences, to be transmitted to memory dies 104. A RAID (Redundant Array of Independent Dies) module 254 manages generation of RAID parity and recovery of failed data. The RAID parity may be used as an additional level of integrity protection for the data being written into the memory device 200. In some cases, the RAID module 254 may be a part of the ECC engine 250. Note that the RAID parity may be added as one or more extra dies, or may be added within the existing die, e.g., as an extra plane, an extra block, or extra WLs within a block. As described above in connection with FIG. 2A, the memory interface circuit 234 provides command sequences 230 to memory die 104 and receives status information from memory die 104, via memory interface 224. A flash control layer 256 controls the overall operation of back-end module 238.

Additional components of memory device 200 illustrated in FIG. 2B include media management layer (MML) 258, which performs wear leveling of memory cells of memory dies 104, as well as, other discrete components 260, such as external electrical interfaces, external RAM, resistors, capacitors, or other components that may interface with storage controller 102. In alternative embodiments, one or more of the physical layer interface 248, RAID module 254, MML 258, or buffer management/bus controller 240 are optional components.

MML 258 (e.g., Flash Translation Layer (FTL)) may be integrated as part of the flash management for handling flash errors and interfacing with the host. In particular, MML 258 may be a module in flash management and may be responsible for the internals of NAND management. In particular, MML 258 may include an algorithm in the memory device firmware which translates writes from the host into writes to the memory structure 205 of each memory die 104. MML 258 may be needed because: 1) the memory structure 206 may have limited endurance; 2) the memory structure 206 may only be written in multiples of pages; and/or 3) the memory structure 206 may not be written unless it is erased as a block (or a tier within a block in some embodiments). MML 258 understands these potential limitations of the memory structure 206 which may not be visible to the host. Accordingly, MML 258 attempts to translate the writes from host into writes into the memory structure 206.

Storage controller 102 may interface with one or more memory dies 104. In one embodiment, storage controller 102 and multiple memory dies (together comprising non-volatile storage system 100) implement an SSD, which can emulate, replace, or be used in place of a hard disk drive inside a host, as a network access storage (NAS) device, in a laptop, in a tablet, in a server, etc. Additionally, the SSD need not be made to work as a hard drive.

Some embodiments of the memory device 200 may include one memory dies 104 connected to one storage controller 102. Other embodiments may include multiple memory dies 104 in communication with one or more controllers 102. In one example, the multiple memory dies 104 can be grouped into a set of memory packages. Each memory package may include one or more memory dies 104 in communication with storage controller 102. In one embodiment, a memory package includes a printed circuit board (or similar structure) with one or more memory dies 104 mounted thereon. In some embodiments, a memory package can include molding material to encase the memory dies 104 of the memory package. In some embodiments, storage controller 102 is physically separate from any of the memory packages.

Figure 2C:
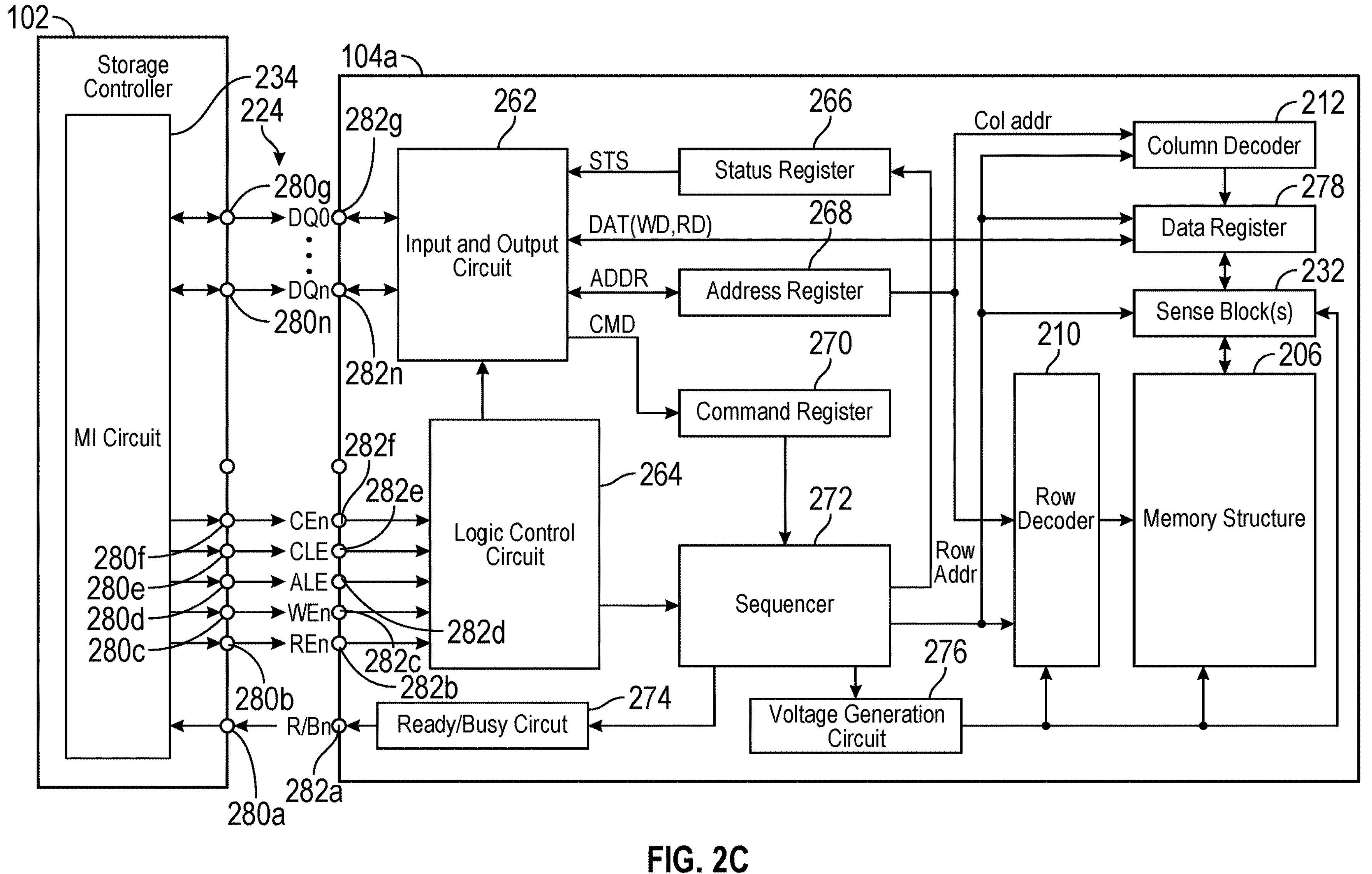
FIG. 2C is a block diagram of example memory system that depicts more details of an example embodiment of memory die, in connection with which, example embodiments of the disclosed technology can be implemented.

FIG. 2C is a block diagram of example memory system 200 that depicts more details of one embodiment of memory die 104*a*. With reference to FIG. 2B above, the memory die 104*a* is connected to the storage controller 102 via the memory interface 224 and operates based on commands from the storage controller 102.

For example, the memory die 104*a* transmits and receives, for example, DQ0 to DQn (hereinafter simply referred to as signals DQ or signals DQ[0:n], where n is an integer of the number of lines) to and from the storage controller 102. The DQ[0:n] signals may be an n-bit wide signa, where each DQ signal is a 1-bit wide signal. In various embodiments, n may be 7, thus DQ[7:0] signals is an 8-bit wide signal. The DQ[0:n] signals may be encoded with input/output (I/O) data, for example, data in (DIN)/data out (DOUT) for data operations (e.g., read operations, write operations, erase operations, etc.) and address data (e.g., address codes) and command data (e.g., command codes) for command/address sequencing of for the data operations. Data sent over the DQ[0:n] signals is latched with respect to a rising edge or a falling edge of a clock signal or data strobe (DQS) signal. In a single data rate ("SDR") mode, the data is latched on either the rising edge or the falling edge of the clock signal. In a double data rate ("DDR") mode (also referred to herein as toggle mode), the data is latched on both the rising and falling edges of the clock signal.

The memory die 104*a* also receives control signals, such as, but not limited to, CEn signal, CLE signal, ALE signal, WEn signal, REn signal, DQS signal, and the like from the storage controller 102 via the control bus 226 of the memory interface 224. Then, the memory die 104*a* also transmits control signals, for example but not limited to, a ready/busy signal (R/Bn) to the storage controller 102. In some embodiments, each of control signals may be a one-bit wide signal. In other embodiments, the control signals may have other bit-widths as desired.

The CEn signal is a signal for enabling the memory die 104*a*. In various embodiments, the CEn signal is an active-low CEn, such that the CEn is asserted at a logic LOW level (e.g., logic level 0 or low voltage (0 volt)) to enable the memory die 104*a*. A memory array 202 may include a plurality of memory dies 104, each of which may be substantially similar to memory die 104*a* and activated based on receiving the CEn signal. In some embodiments, memory dies that are not used for a specific task may remain in a standby state. In the standby state, the memory dies do not respond to control signals from the storage controller 102. After asserting the CEn signal, the activated memory die starts responding to the control signals from the storage controller 102. For example, when the storage controller 102 desires to activate memory die 104*a*, the storage controller 102 asserts the CEn signal at a logic LOW level.

The CLE signal is an active-high signal, according to various embodiments, for enabling command sequencing, for example, by indicating that the DQ[0:n] signal is encoded with a command code (also referred to as CMD) and is asserted, for example, at a logic HIGH level (e.g., logic level 1 or high voltage (e.g., 5 volts)), according to some embodiments. The CLE signal may be used to activate a command bus (e.g., of control bus 226) between the storage controller 102 and the memory die 104*a*, for example, when the CLE signal is asserted at a logic HIGH level.

The ALE signal is an active-high signal, according to various embodiments, for enabling address sequencing, for example, by indicating that the signal DQ is encoded with an address code (also referred to as ADDR) and is asserted, for example, at the logic HIGH level. The ALE signal may be used to activate an address bus (e.g., of control bus 226) between the storage controller 102 and the memory die 104*a*, for example, when the ALE signal is asserted at a logic HIGH level.

When the memory die 104*a* receives the ALE signal that is at a logic LOW level and the CLE signal that is at a logic HIGH level, the memory die 104*a* knows that the storage controller 102 is sending command data on the DQ[0:n] signals, which is latched into a command register 270. Similarly, when the memory die 104*a* receives the ALE signal at a logic HIGH level and the CLE signal at a logic LOW level, the memory die 104*a* knows that address data is being sent by the storage controller 102 and the address data is latched into an address register 268 of the memory die 104*a*.

The WEn signal is a clock signal for sampling a received signal into the memory die 104*a*. For example, a signal received by the memory die 104*a* is sampled and latched at each rising or falling edge of the WEn signal to obtain a bit pattern encoded into the received signal. Accordingly, DQ[0:

n] signals are received in the memory die 104*a* when the WEn signal is toggled. For example, command data and/or address data sent to the memory die 104*a* may be latched with respect to a rising edge and/or a falling edge of the WEn signal. In various embodiments, WEn signal may be latched in SDR mode or DDR mode.

The REn signal is a signal used for the storage controller 102 to read data from the memory die 104*a*. For example, data is read out of the memory die 104*a* at each rising or falling edge of the REn signal. Accordingly, the memory die 104*a* outputs the DQ[0:n] signals to the storage controller 102 based on the toggled REn signal. The R/Bn signal is a signal indicating whether the memory die 104*a* is in a busy state or a ready state (in a state in which a command is not receivable or receivable from the storage controller 102) and is considered to be at the logic LOW level, for example, when the memory die 104*a* is in the busy state.

While the above example provides the CEn signal as an active-low signal and the CLE and ALE signals as active-high signals, other implementations are possible. In some embodiments, the active states may be reversed. For example, the CEn signal may be an active-high signal and the CLE and ALE signals may be active-low signals.

The storage controller 102 issues a command to perform a read operation, a command to perform a write operation, a command to perform an erase, or the like to the memory die 104*a* in response to a command from a host device (e.g., host device 106 and/or 112). The storage controller 102 manages the memory space of the memory die 104*a*. As part of the read, write, or erase operations, the memory die 104*a* issues various commands to perform command/address sequencing for a respective operation and the memory die 104*a* and/or storage controller 102 transmit DIN/DOUT to complete the respective operation.

As described above, the memory interface circuit 234 of the storage controller 102 connects to the input/output circuit 222 of the memory die 104*a* via a plurality of electrical contacts. As used herein, electrical contacts may be referred to as pins or pins of a chip for electrically connecting the memory die 104*a* to the storage controller 102. For example, the storage controller 102 includes a plurality of pins 280*a-n* electrically connected to a plurality of pins 282*a-n* of the memory die 104*a*. The memory interface circuit 234 transmits the CEn signal, CLE signal, ALE signal, and WEn signals to the memory die 104*a* over the control bus 226 of the memory interface 224 via respective pins and transmits DQ [0:n] signals over the data bus 228 of the memory interface 224 via respective pins. The input/output circuit 222 transmits the R/Bn signal to the storage controller 102 over the control bus 226 and the DQ [0:n] signals over the data bus 228 via respective pins. The pins may also be referred to as receivers or transmitters. For example, where a signal is transmitted from a pin on the storage controller to a pin of the memory die, the transmitting pin may be referred to as an transmitter and the receiving pin may be referred to as a receiver. Each pin may be referred to as either a receiver or output transmitted based on the scenario, for example, one pin may transmit at a first instance while the pin may also receive at a second instance.

As illustrated in FIG. 2C, the memory die 104*a* includes an input and output circuit 262, a logic control circuit 264, a status register 266, an address register 268, a command register 270, a sequencer 272, a ready/busy circuit 274, a voltage generation circuit 276, and a data register 278. The various components 262-278 may be included as part of the die controller 204, for example, as part of the control circuit 214 and/or decoder circuit 216. FIG. 2C also illustrates the memory structure 206, row decoder 210, a sense blocks 232, and column decoder 212, as described above in connection with FIG. 2B.

The input and output circuit 262 controls input and output of the DQ [0:n] signals to and from the storage controller 102. For example, the input and output circuit 262 transmits data received from the storage controller 102 as DIN to data register 278, transmits an address code to the address register 268, and transmits a command code to the command register 270. DIN, the command code, and the address are transmitted to the memory die 104*a* as DQ [0:n] signals encoded with a bit pattern for the DIN, command, or address. The input and output circuit 262 also transmits status information STS received from the status register 266, data received from the data register 278 to be transmitted to the storage controller 102 as DOUT. STS and DOUT are transmitted as DQ [0:n] signals encoded with a bit pattern for the STS or DOUT. The input and output circuit 262 and the data register 278 are connected via a data bus. For example, the data bus includes eight I/O data lines 100 to 107 corresponding to the 8-bit signals DQ0 to DQ7. The number of I/O data lines is not limited to eight, but may be set to 16, 32, or any number of data lines.

The logic control circuit 264 receives, for example, the CEn signal, the CLE signal, the ALE signal, the WEn signal, and the REn signal from the storage controller 102 via control bus 226. Then, logic control circuit 264 controls the input and output circuit 262 and the sequencer 272 in accordance with a received signal.

The status register 266 temporarily stores status information STS, for example, in a write operation, a read operation, and an erasing operation for data and notifies the storage controller 102 whether the operation normally ends.

The address register 268 temporarily stores the address code received from the storage controller 102 via the input and output circuit 262. For example, the input and output circuit 262 may detect DQ[0:n] signals and sample the DQ[0:n] signals according to the WEn signal to obtain a bit pattern encoded thereon. The input and output circuit 262 may then decode the bit pattern to obtain the data, which in this case may be an address code. The address code is then temporarily stored in the address register 268. Then, the address register 268 transmits a row address (row addr) to the row decoder 210 and transmits a column address (col addr) to the column decoder 212.

The command register 270 temporarily stores the command code received from the storage controller 102 via the input and output circuit 262 and transmits the command code to the sequencer 272. For example, the input and output circuit 262 may detect DQ[0:n] signals and sample the DQ[0:n] signals according to the WEn signal to obtain a bit pattern encoded thereon. The input and output circuit 262 may then decode the bit pattern to obtain the data, which in this case may be a command code. The command code is then temporarily stored in the command register 270.

The sequencer 272 controls operation of the memory die 104*a*. For example, the sequencer 272 controls the status register 266, the ready/busy circuit 274, the voltage generation circuit 276, the row decoder 210, the sense blocks 232, the data register 278, the column decoder 212, and the like according to a command code stored in the command register 270 to execute the write operation, the read operation, and the erasing operation according to the code.

The ready/busy circuit 274 transmits the R/Bn signal to the storage controller 102 according to an operation state of the sequencer 272. For example, the R/Bn signal is transmitted to the storage controller 102 via the control bus 226 of the memory interface 224.

The voltage generation circuit 276 generates a voltage necessary for an operation (e.g., a write operation, a read operation, or an erasing operation) according to control of the sequencer 272. The voltage generation circuit 276 may be an example of the power control circuit 215 of FIG. 2A. The voltage generation circuit 276 supplies the generated voltage, for example, to the memory structure 206, the row decoder 210, and the sense blocks 232. The row decoder 210 and the sense blocks 232 apply a voltage supplied from the voltage generation circuit 276 to memory cells in the memory structure 206. Details of the memory structure 206 are provided in connection with FIGS. 3-4G below.

The data register 278 includes a plurality of latch circuits. The latch circuit stores the write data WD and the read data RD. For example, in a write operation, the data register 278 temporarily stores the write data WD received from the input and output circuit 262 and transmits the write data WD to the sense blocks 232. For example, in a read operation, the data register 278 temporarily stores the read data RD received from the sense blocks 232 and transmits the read data RD to the input and output circuit 262.

Figure 3:
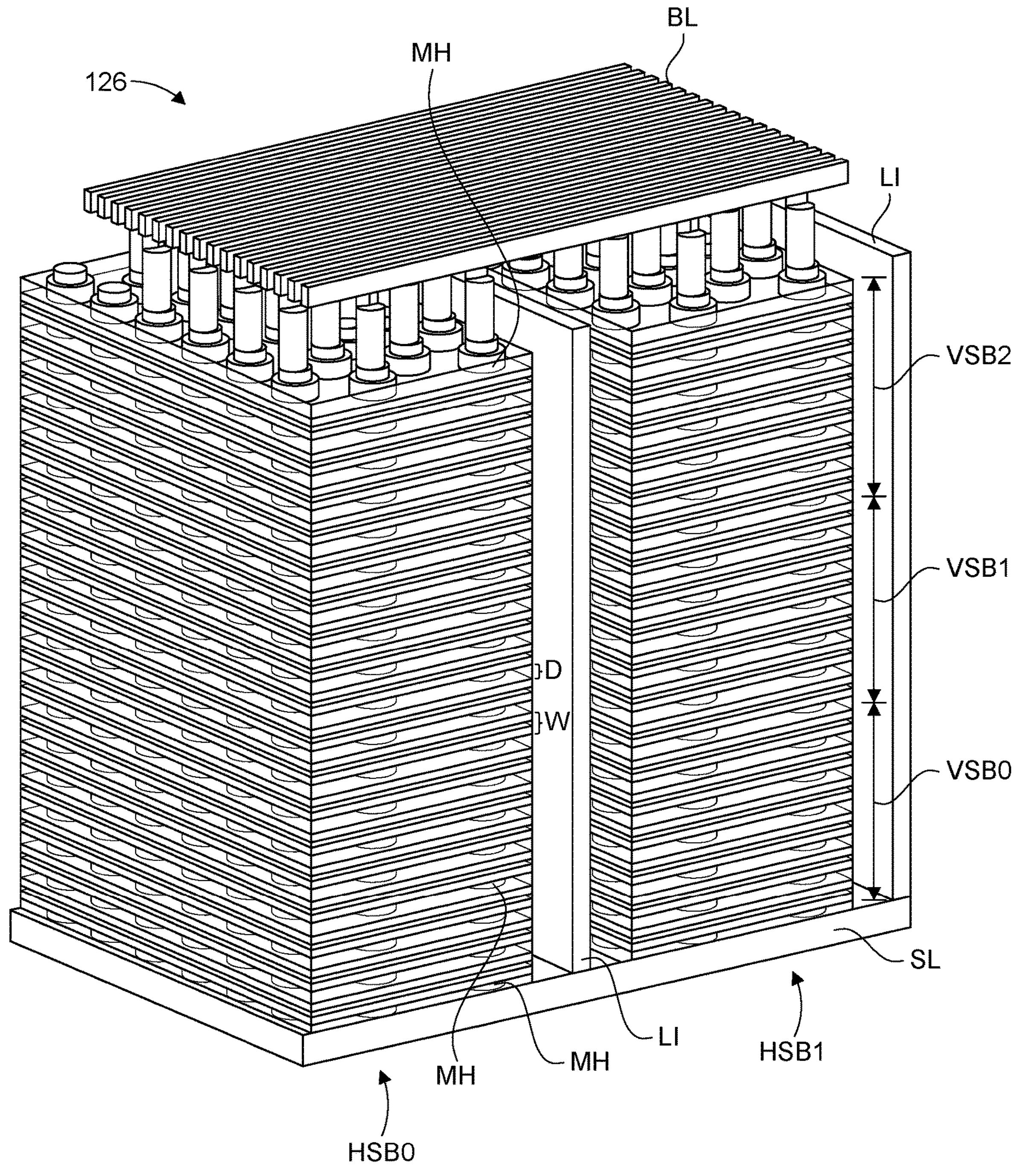
FIG. 3 is a perspective view of a portion of an example monolithic three-dimensional memory structure, in connection with which, example embodiments of the disclosed technology can be implemented.

FIG. 3 is a perspective view of a portion of a monolithic 3D memory array that includes a plurality of non-volatile memory cells, and that can comprise memory structure 206 in one embodiment. FIG. 3 illustrates, for example, a portion of one block of memory. The structure depicted includes a set of bitlines (BLs) positioned above a stack of alternating dielectric layers and conductive layers. For example purposes, one of the dielectric layers is marked as D and one of the conductive layers (also called wordline layers) is marked as W. The number of alternating dielectric and conductive layers can vary based on specific implementation requirements. In some embodiments, the 3D memory array includes between 108-300 alternating dielectric and conductive layers. One example embodiment includes 96 data wordline layers, 8 select layers, 6 dummy wordline layers, and 110 dielectric layers. More or less than 108-300 layers can also be used. Data wordline layers include data memory cells. Dummy wordline layers include dummy memory cells. As will be explained below, the alternating dielectric and conductive layers are divided into four "fingers" by local interconnects LI. FIG. 3 shows two fingers and two local interconnects LI. Below the alternating dielectric layers and wordline layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the 3D monolithic memory array that may comprise memory structure 206 is provided below with respect to FIGS. 4A-4H.

One of the local interconnects LI separates the block into two horizontal sub-blocks HSB0, HSB1. The block comprises multiple vertical sub-blocks VSB0, VSB1, VSB2. The vertical sub-blocks VSB0, VSB1, VSB2 can also be referred to as "tiers." Each vertical sub-block extends across the block, in one embodiment. Each horizontal sub-block HSB0, HSB1 in the block is a part of vertical sub-block VSB0. Likewise, each horizontal sub-block HSB0, HSB1 in the block is a part of vertical sub-block VSB1. Likewise, each horizontal sub-block HSB0, HSB1 in the block is a part of vertical sub-block VSB2. For ease of explanation, vertical sub-block VSB0 will be referred to as a lower vertical sub-block, vertical sub-block VSB1 will be referred to as a middle vertical sub-block, and VSB2 will be referred to as an upper vertical sub-block. In one embodiment, there are two vertical sub-blocks in a block. In other embodiments, there could be four or more vertical sub-blocks in a block.

A memory operation for a vertical sub-block may be performed on memory cells in one or more horizontal sub-blocks. For example, a programming operation of memory cells in vertical sub-block VSB0 may include: programming memory cells in horizontal sub-block HSB0 but not horizontal sub-block HSB1; programming memory cells in horizontal sub-block HSB1 but not horizontal sub-block HSB0; or programming memory cells in both horizontal sub-block HSB0 and horizontal sub-block HSB1.

The different vertical sub-blocks VSB0, VSB1, VSB2 are treated as separate units for erase/program purposes, in one embodiment. For example, the memory cells in one vertical sub-block can be erased while leaving valid data in the other vertical sub-blocks. Then, memory cells in the erased vertical sub-block can be programmed while valid data remains in the other vertical sub-blocks. In some cases, memory cells in the middle vertical sub-block VSB1 are programmed while there is valid data in the lower vertical sub-block VSB0 and/or the upper vertical sub-block VSB2. Programming the memory cells in middle vertical sub-block VSB1 may present challenges due to the valid data in the other vertical sub-blocks VSB0, VSB2.

Figure 4A:
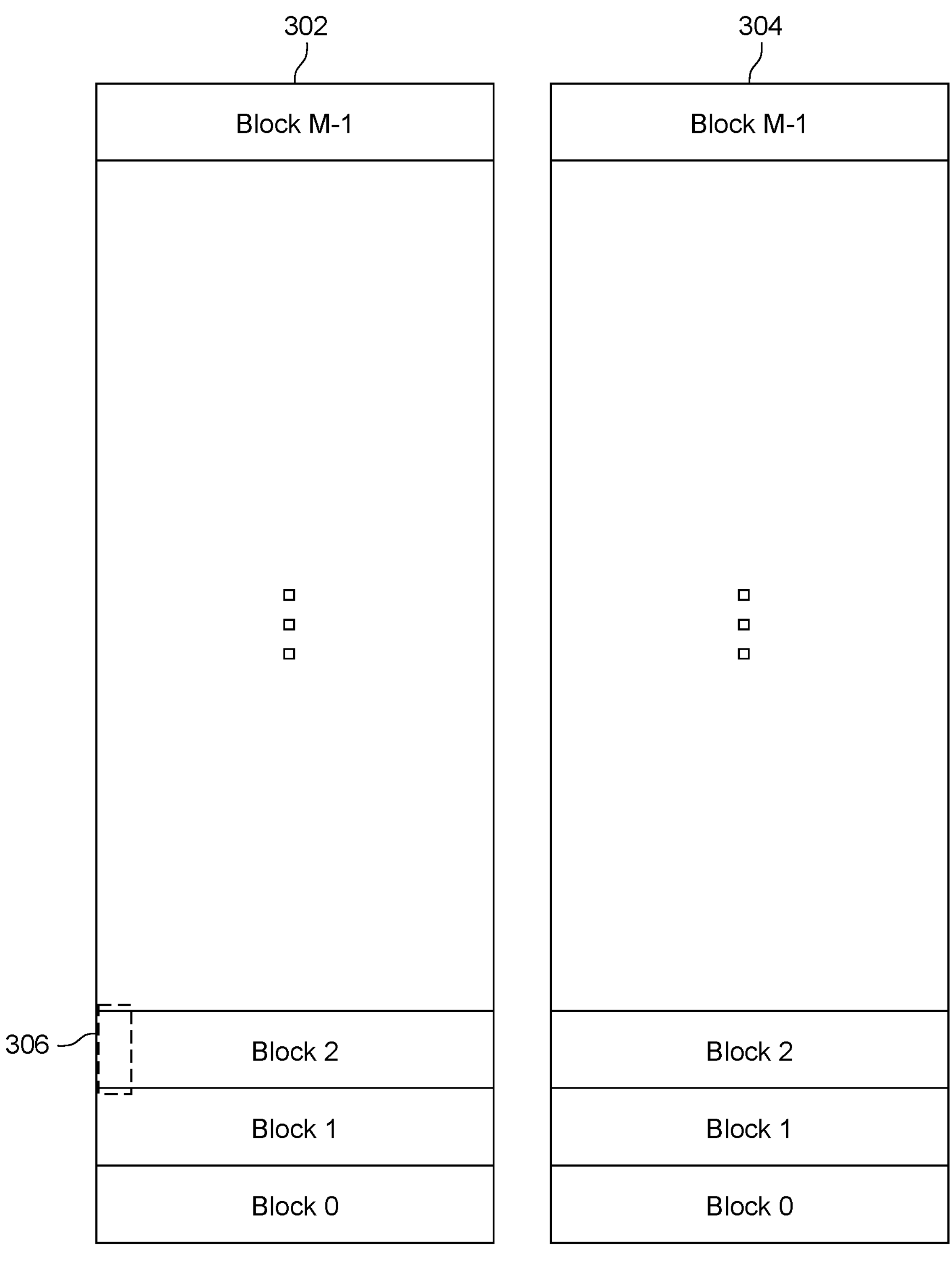
FIG. 4A is a block diagram of an example memory structure having two planes, in connection with which, example embodiments of the disclosed technology can be implemented.

FIG. 4A is a block diagram depicting one example organization of memory structure 206, which is divided into two planes 302 and 304. Each plane is then divided into M blocks. In one example, each plane has about 2000 blocks. However, different numbers of blocks and planes can also be used. In one embodiment, a block of memory cells constitutes a single unit for an erase operation. That is, in one embodiment, all memory cells of a block are erased together. In other embodiments, memory cells can be grouped into blocks for other reasons, such as to organize the memory structure 206 to enable the signaling and selection circuits. In some embodiments, a block represents a groups of connected memory cells that share a common set of wordlines.

Figure 4B:
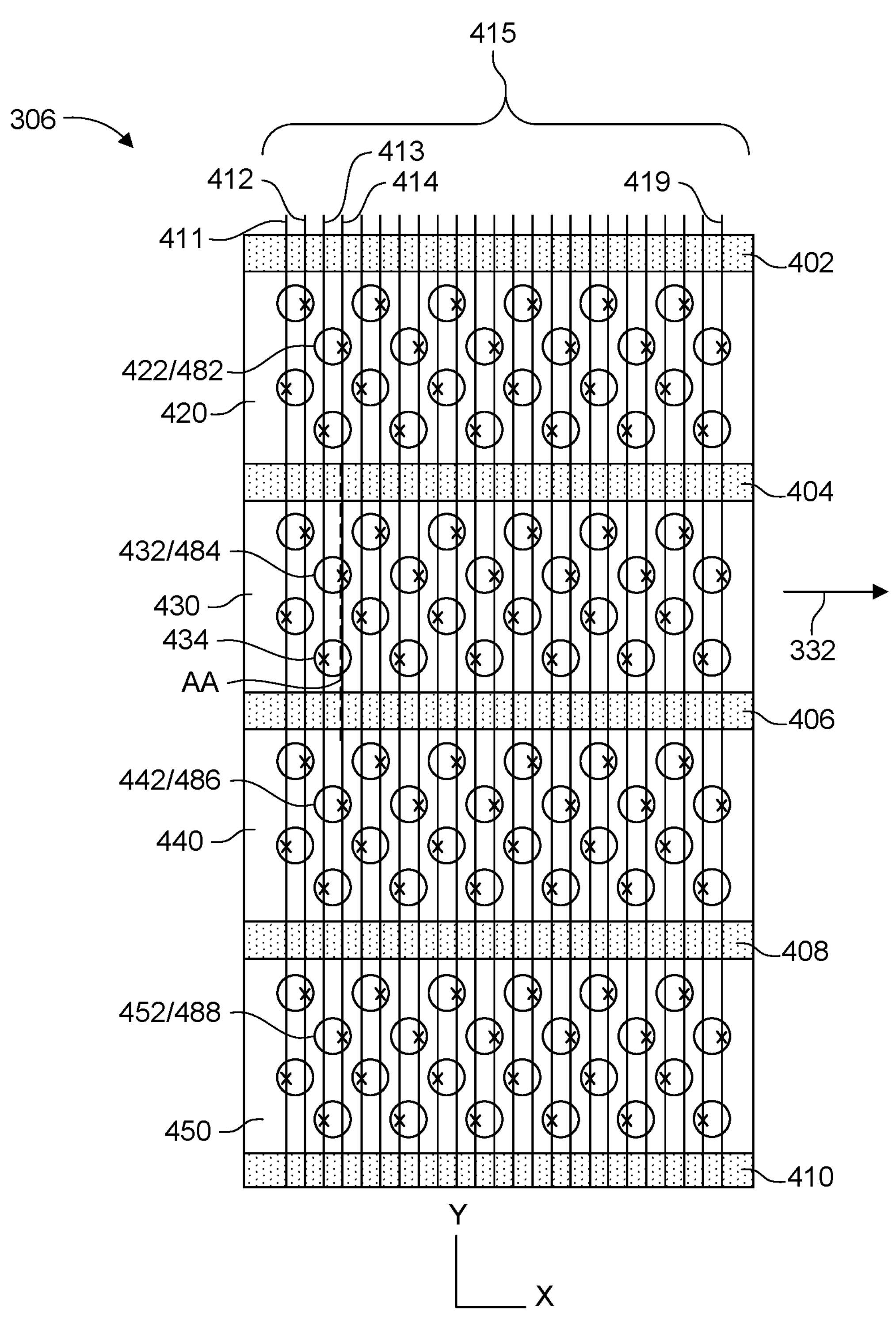
FIG. 4B depicts a top view of a portion of a block of example memory cells, in connection with which, example embodiments of the disclosed technology can be implemented.

FIGS. 4B-4F depict an example 3D NAND structure that corresponds to the structure of FIG. 3 and that can be used to implement memory structure 206 of FIGS. 2A and 2B. Although the example memory system of FIGS. 3-4H is a 3D memory structure that includes vertical NAND strings with charge-trapping material, it should be appreciated that other (2D and 3D) memory structures can also be used with the technology described herein. FIG. 4B is a block diagram depicting a top view of a portion of one block from memory structure 206. The portion of the block depicted in FIG. 4B corresponds to portion 306 in block 2 of FIG. 4A. As can be seen from FIG. 4B, the block depicted in FIG. 4B extends in the direction of 332. While in some embodiments, the memory array may have many layers, FIG. 4B illustrates only the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482.

Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B.

FIG. 4B also depicts a set of bitlines 415, including bitlines 411, 412, 413, 414, . . . 419. FIG. 4B shows twenty-four bitlines because only a portion of the block is depicted. It is contemplated that more than twenty-four bitlines connected to vertical columns of the block. Each of the circles representing vertical columns has an "x" to indicate its connection to one bitline. For example, bitline 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as wordline fingers that are separated by the local interconnects. In one embodiment, the wordline fingers on a common level of a block connect together to form a single wordline. In another embodiment, the wordline fingers on the same level are not connected together. In one example implementation, a bitline only connects to one vertical column in each of regions 420, 430, 440 and 450. In that implementation, each block has sixteen rows of active columns and each bitline connects to four rows in each block. In one embodiment, all of the four rows connected to a common bitline are connected to the same wordline (via different wordline fingers on the same level that are connected together), in which case, the system uses the source side selection lines and the drain side selection lines to choose one (or another subset) of the four to be subjected to a memory operation (program, verify, read, and/or erase).

Although FIG. 4B shows four regions and sixteen rows of vertical columns in a block, with each region having four rows of vertical columns, those exact numbers are an example implementation. Other embodiments may include more or less regions per block, more or less rows of vertical columns per region, and/or more or less rows of vertical columns per block. FIG. 4B also shows the vertical columns being staggered. In other embodiments, different patterns of staggering can be used. In some embodiments, the vertical columns may not be staggered.

Figure 4C:
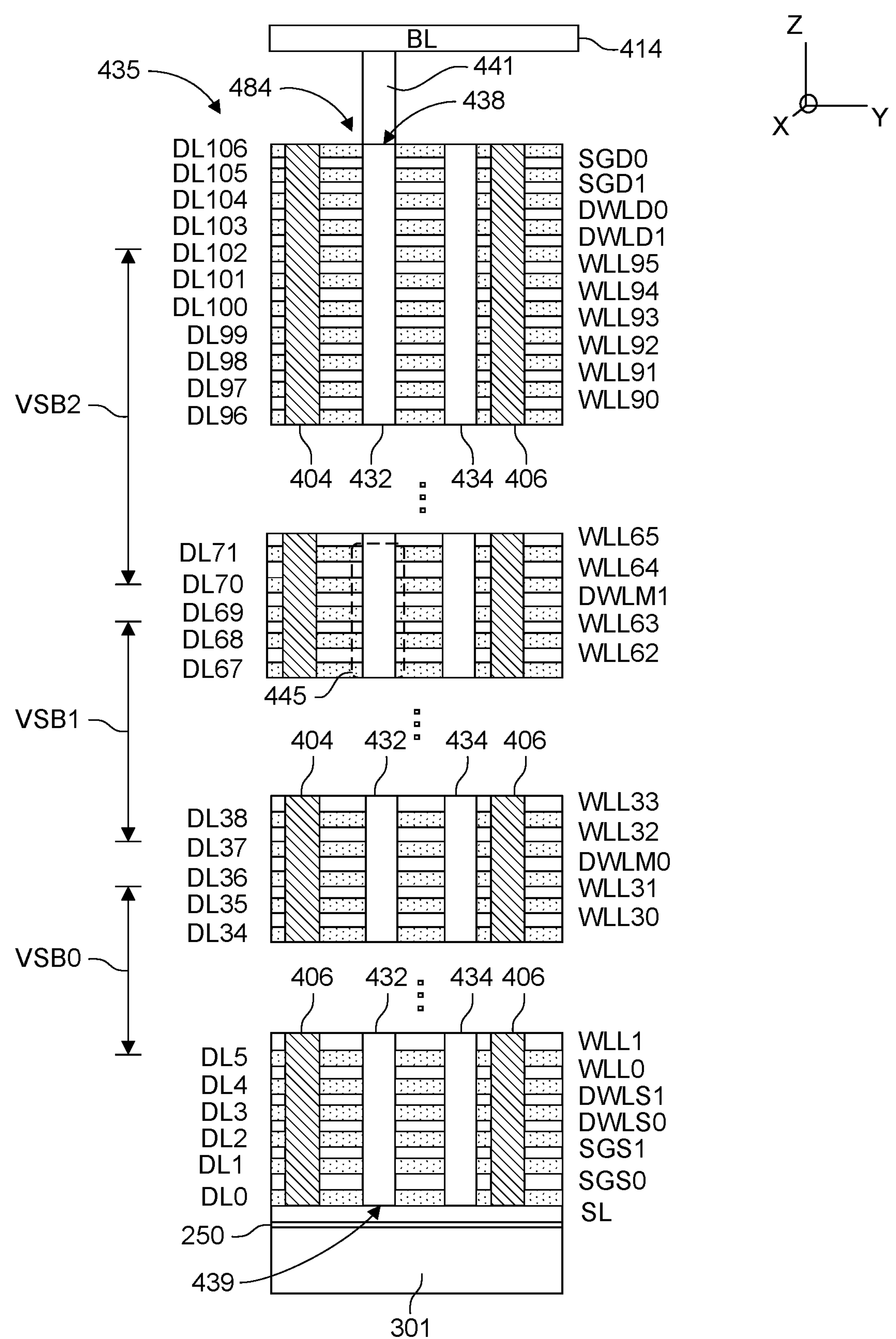
FIG. 4C depicts a stack showing a cross-sectional view along line AA of FIG. 4B.

FIG. 4C depicts an embodiment of a stack 435 showing a cross-sectional view along line AA of FIG. 4B. Two SGD layers (SGD0, SDG1), two SGS layers (SGS0, SGS1) and six dummy wordline layers DWLD0, DWLD1, DWLM1, DWLM0, DWLS0 and DWLS1 are provided, in addition to the data wordline layers WLL0-WLL95. Each NAND string has a drain side select transistor at the SGD0 layer and a drain side select transistor at the SGD1 layer. In operation, the same voltage may be applied to each layer (SGD0, SGD1), such that the control terminal of each transistor receives the same voltage. Each NAND string has a source side select transistor at the SGS0 layer and a drain side select transistor at the SGS1 layer. In operation, the same voltage may be applied to each layer (SGS0, SGS1), such that the control terminal of each transistor receives the same voltage. Also depicted are dielectric layers DL0-DL106.

Columns 432, 434 of memory cells are depicted in the multi-layer stack. The stack includes a substrate 301, an insulating film 250 on the substrate, and a portion of a source line SL. A portion of the bitline 414 is also depicted. Note that NAND string 484 is connected to the bitline 414. NAND string 484 has a source-end 439 at a bottom of the stack and a drain-end 438 at a top of the stack. The source-end 439 is connected to the source line SL. A conductive via 441 connects the drain-end 438 of NAND string 484 to the bitline 414. The metal-filled slits 404 and 406 from FIG. 4B are also depicted.

The stack 435 is divided into three vertical sub-blocks (VSB0, VSB1, VSB2). Vertical sub-block VSB0 includes WLL0-WLL31. Layers SGS0, SGS1, DWLS0, DWLS1 could also be considered to be a part of vertical sub-block VSB0. Vertical sub-block VSB1 includes WLL32-WLL63. Layers SGD0, SGD1, DWLD0, DWLD1 could also be considered to be a part of vertical sub-block VSB2. Vertical sub-block VSB2 includes WLL64-WLL95. Each NAND string has a set of data memory cells in each of the vertical sub-blocks. Dummy wordline layer DMLM0 is between vertical sub-block VSB0 and vertical sub-block VSB1. Dummy wordline layer DMLM1 is between vertical sub-block VSB1 and vertical sub-block VSB2. The dummy wordline layers have dummy memory cell transistors that may be used to electrically isolate a first set of memory cell transistors within the memory string (e.g., corresponding to vertical sub-block VSB0 wordlines WLL0-WLL31) from a second set of memory cell transistors within the memory string (e.g., corresponding to the vertical sub-block VSB1 wordlines WLL32-WLL63) during a memory operation (e.g., an erase operation or a programming operation).

In another embodiment, one or more middle junction transistor layers are used to divide the stack 435 into vertical sub-blocks. A middle junction transistor layer contains junction transistors, which do not necessarily contain a charge storage region. Hence, a junction transistor is typically not considered to be a dummy memory cell. Both a junction transistor and a dummy memory cell may be referred to herein as a "non-data transistor." A non-data transistor, as the term is used herein, is a transistor on a NAND string, where the transistor is either configured to not store user or system data or operated in such a way that the transistor is not used to store user data or system data. A wordline that is connected to non-data transistors is referred to herein as a non-data wordline. Examples of non-data wordlines include, but are not limited to, dummy wordlines, a select line in a middle junction transistor layer, or the like.

The stack 435 may have more than three vertical sub-blocks. For example, the stack 435 may be divided into four, five, or more vertical sub-blocks. Each of the vertical sub-blocks may contain at least one data memory cell. In some embodiments, additional layers similar to the middle dummy wordline layers DWLM may be provided to divide the stack 435 into the additional vertical sub-blocks. In one embodiment, the stack has two vertical sub-blocks.

Figure 4D:
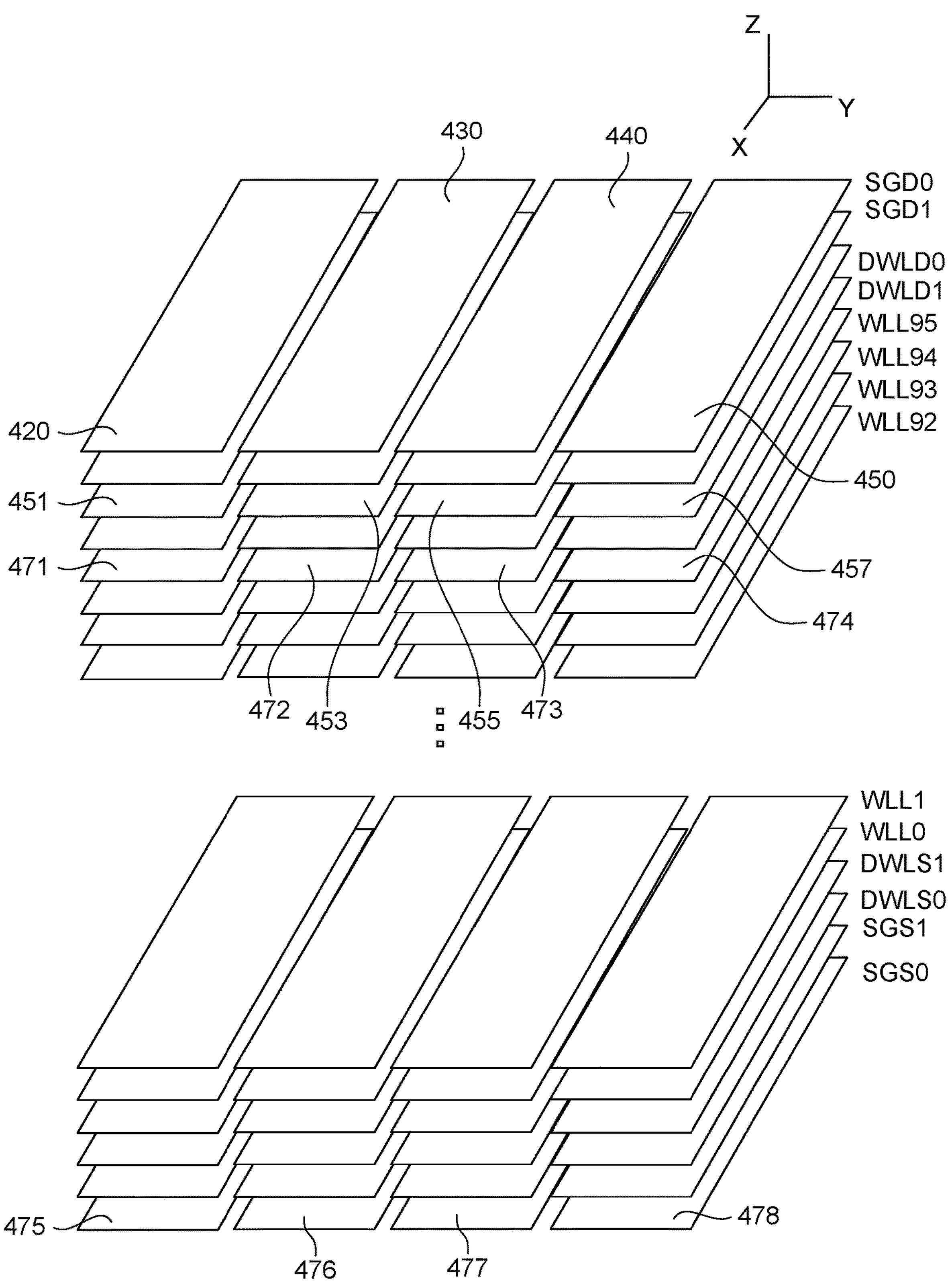
FIG. 4D depicts an alternative view of the select gate layers and wordline layers of the stack of FIG. 4C.

FIG. 4D depicts an alternative view of the SG layers and wordline layers of the stack 435 of FIG. 4C. Each of SGD layers SGD0 and SGD0 (the drain side SG layers) includes parallel rows of SG lines associated with the drain side of a set of NAND strings. For example, SGD0 includes drain side SG regions 420, 430, 440 and 450, consistent with FIG. 4B. Below the SGD layers are the drain side dummy wordline layers. In one implementation, each dummy wordline layer represents a wordline that is connected to a set of dummy memory cells at a given height in the stack. For example, DWLD0 includes wordline layer regions 451, 453, 455 and 457. A dummy memory cell, also referred to herein as a non-data memory cell, does not store data and is ineligible to store data, while a data memory cell is eligible to store data. Moreover, the threshold voltage Vth of a dummy memory cell is generally fixed at the time of manufacture or may be periodically adjusted, while the Vth of the data memory cells changes more frequently, e.g., during erase and programming operations of the data memory cells.

Below the dummy wordline layers are the data wordline layers. For example, WLL95 comprises wordline layer regions 471, 472, 473 and 474. Below the data wordline layers are the source side dummy wordline layers. Below the source side dummy wordline layers are the SGS layers. Each of the SGS layers SGS0 and SGS1 (the source side SG layers) includes parallel rows of SG lines associated with the source side of a set of NAND strings. For example, SGS0 includes source side SG lines 475, 476, 477 and 478. In some embodiments, each SG line is independently controlled, while in other embodiments, the SG lines are connected and commonly controlled.

Figure 4E:
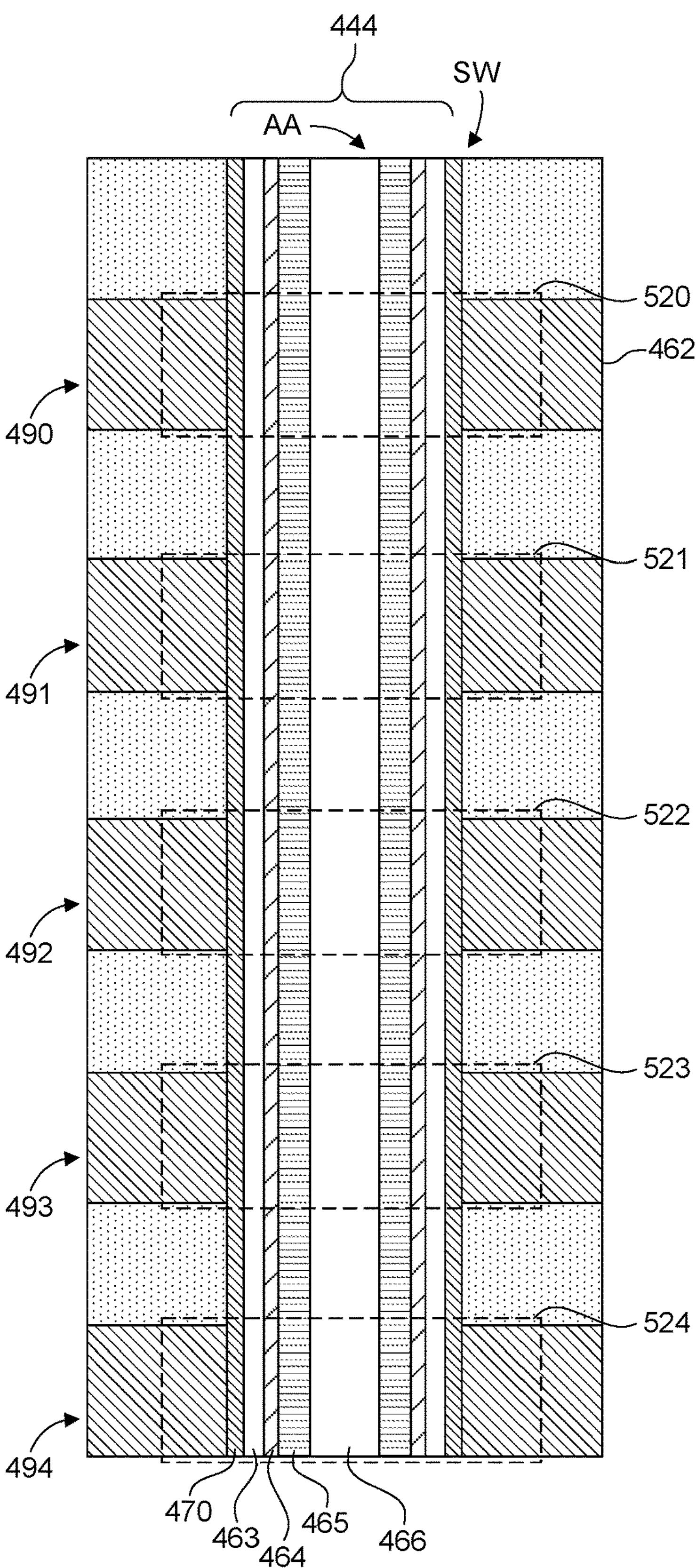
FIG. 4E depicts a view of a region of FIG. 4C.

FIG. 4E depicts a view of the region 445 of FIG. 4C. Data memory cell transistors 520 and 521 are above dummy memory cell transistor 522. Below dummy memory cell transistor 522 are data memory cell transistors 523 and 524. A number of layers can be deposited along the sidewall (SW) of the memory hole 444 and/or within each wordline layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A wordline layer can include a conductive metal 462 such as tungsten as a control gate. For example, control gates 490, 491, 492, 493 and 494 are provided. In this example, all of the layers except the metal are provided in the memory hole. In other approaches, some of the layers may be in the control gate layer. Additional pillars can be similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Non-data transistors (e.g., select transistors, dummy memory cell transistors) may also include the charge trapping layer 463. For example, in FIG. 4E, dummy memory cell transistor 522 includes the charge trapping layer 463. Thus, the Vth of at least some non-data transistors may also be adjusted by storing or removing electrons from the charge trapping layer 463. However, it is not required that all non-data transistors have an adjustable Vth. For example, the charge trapping layer 463 is not required to be present in every select transistor.

Each of the memory holes can be filled with a plurality of annular layers comprising a blocking oxide layer, a charge trapping layer, a tunneling layer, and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4F:
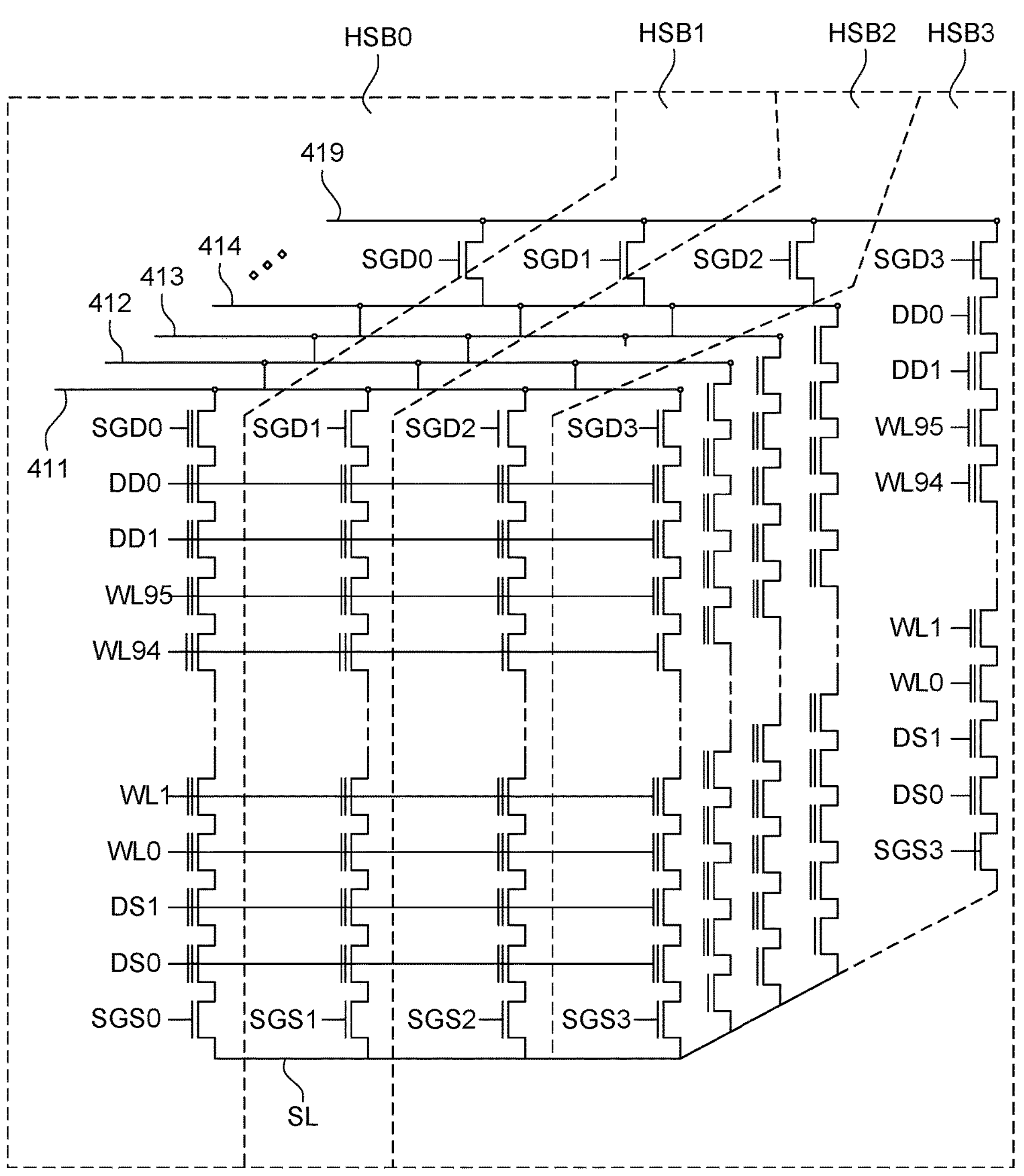
FIG. 4F is a schematic of a plurality of example NAND strings showing multiple horizontal sub-blocks, in connection with which, example embodiments of the disclosed technology can be implemented.

FIG. 4F is a schematic diagram of a portion of the memory depicted in FIGS. 3-4E. FIG. 4F shows physical wordlines WLL0-WLL95 running across the entire block. The structure of FIG. 4F corresponds to portion 306 in Block 2 of FIGS. 4A-E, including bitlines 411, 412, 413, 414, . . . 419. Within the block, each bitline is connected to four NAND strings. Drain side selection lines SGD0, SGD1, SGD2 and SGD3 are used to determine which of the four NAND strings connect to the associated bitline(s). Source side selection lines SGS0, SGS1, SGS2 and SGS3 are used to determine which of the four NAND strings connect to the common source line. The block can also be thought of as divided into four horizontal sub-blocks HSB0, HSB1, HSB2 and HSB3. Horizontal sub-block HSB0 corresponds to those vertical NAND strings controlled by SGD0 and SGS0, horizontal sub-block HSB1 corresponds to those vertical NAND strings controlled by SGD1 and SGS1, horizontal sub-block HSB2 corresponds to those vertical NAND strings controlled by SGD2 and SGS2, and horizontal sub-block HSB3 corresponds to those vertical NAND strings controlled by SGD3 and SGS3.

Figure 4G:
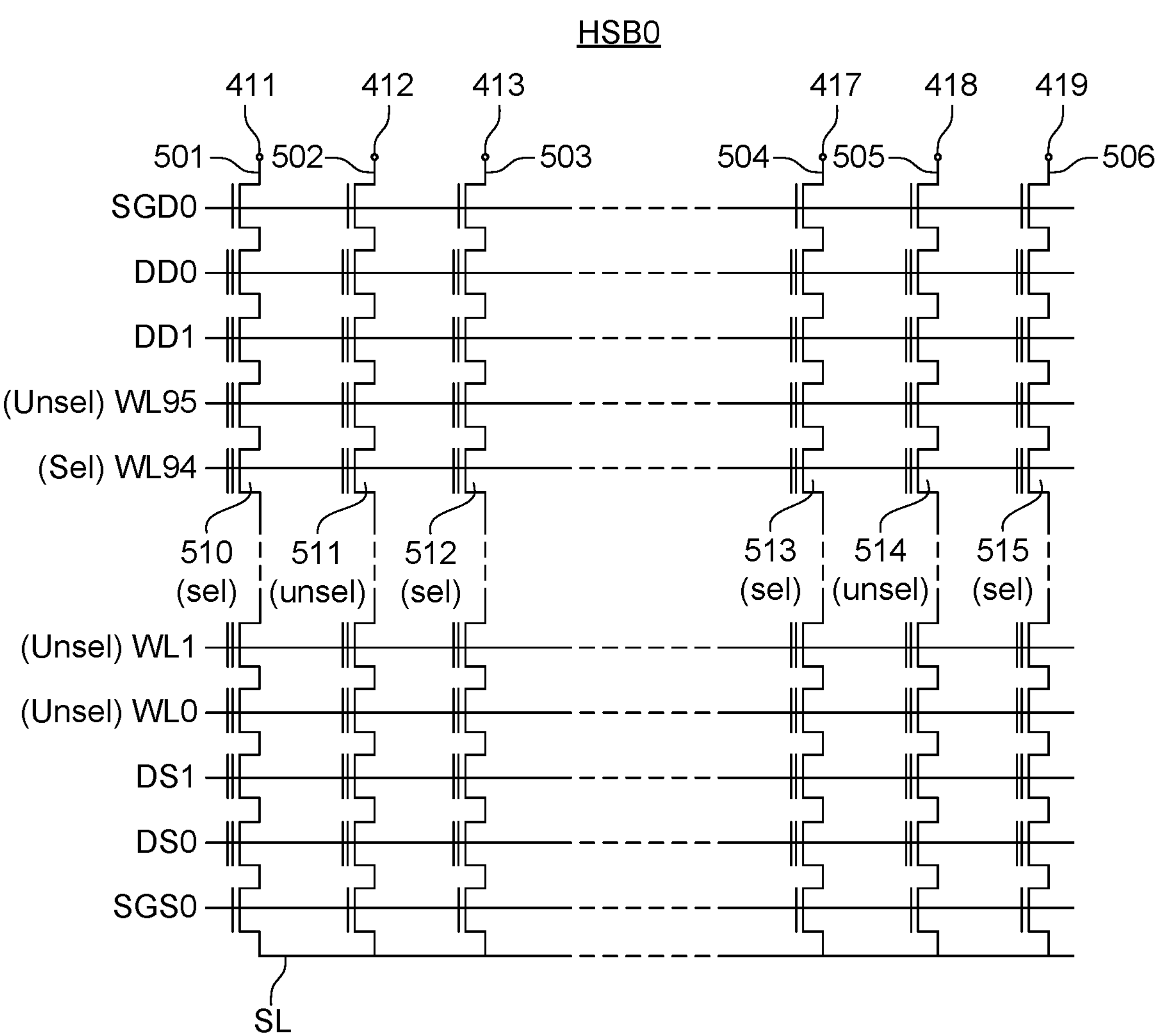
FIG. 4G is a schematic of a plurality of NAND strings showing one example horizontal sub-block, in connection with which, example embodiments of the disclosed technology can be implemented.
Figure 4H:
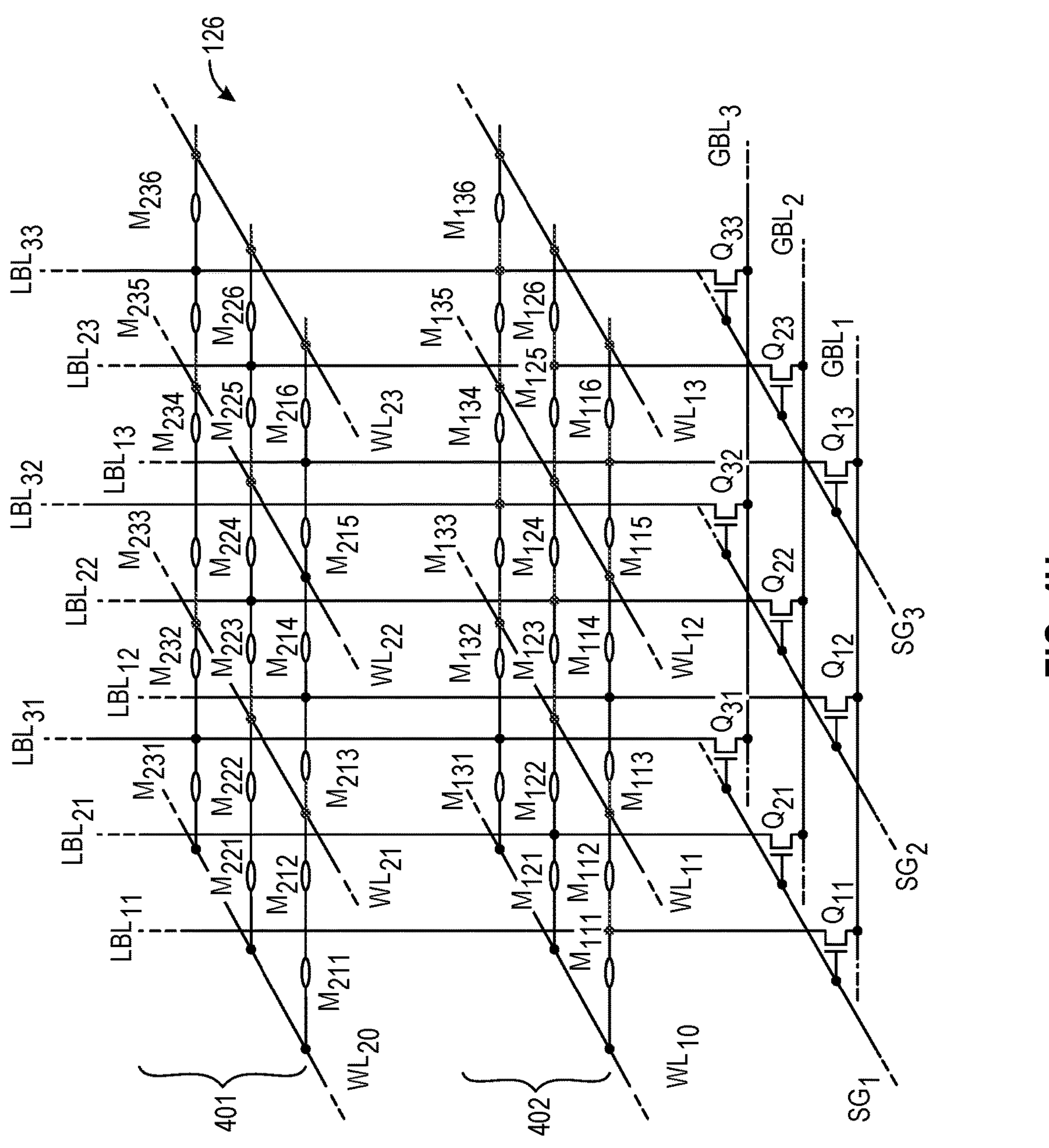
FIG. 4H depicts various embodiments of a portion of a three-dimensional memory array with a vertical cross-point structure, in connection with which, example embodiments of the disclosed technology can be implemented.

FIG. 4G is a schematic of horizontal sub-block HSB0. Horizontal sub-blocks HSB1, HSB2 and HSB3 may have similar structures. FIG. 4G shows physical wordlines WLO-WL95 running across the entire sub-block HSB0. All of the NAND strings of sub-block HSB0 are connected to SGD0 and SGS0. For ease of depiction, FIG. 4G only depicts six NAND strings 501, 502, 503, 504, 505, and 506; however, horizontal sub-block HSB0 may have thousands of NAND strings (e.g., 15,000 or more).

FIG. 4G is being used to explain the concept of a selected memory cell. A memory operation is an operation designed to use the memory for its purpose and includes one or more of reading data, writing/programming data, erasing memory cells, refreshing data in memory cells, and the like. During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

As an example of selected memory cells and unselected memory cells, during a programming process, the set of memory cells intended to take on a new electrical characteristic (or other characteristic) to reflect a changed programming state are referred to as the selected memory cells, while the memory cells that are not intended to take on a new electrical characteristic (or other characteristic) to reflect a changed programming state are referred to as the unselected memory cells. In certain situations, unselected memory cells may be connected to the same wordline as selected memory cells. Unselected memory cells may also be connected to different wordlines than selected memory cells. Similarly, during a reading process, the set of memory cells to be read are referred to as the selected memory cells, while the memory cells that are not intended to be read are referred to as the unselected memory cells.

To better understand the concept of selected memory cells and unselected memory cells, assume a programming operation is to be performed and, for example purposes only, that wordline WL94 and horizontal sub-block HSB0 are selected for programming (see FIG. 4G). That means that all of the memory cells connected to WL94 that are in horizontal sub-blocks HSB1, HSB2 and HSB3 (the other horizontal sub-blocks) are unselected memory cells. Some of the memory cells connected to WL94 in horizontal sub-block HSB0 are selected memory cells and some of the memory cells connected to WL94 in horizontal sub-block HSB0 are unselected memory cells depending on how the programming operation is performed and the data pattern being programmed. For example, those memory cells that are to remain in the erased state (e.g., state S0) will be unselected memory cells because their programming state will not change in order to store the desired data pattern, while those memory cells that are intended to take on a new electrical characteristic (or other characteristic) to reflect a changed programming state (e.g., programmed to states S1-S7) are selected memory cells. Looking at FIG. 4G, assume for example purposes, that memory cells 511 and 514 (which are connected to wordline WL94) are to remain in the erased state; therefore, memory cells 511 and 514 are unselected memory cells (labeled unsel in FIG. 4G). Additionally, assume, for example purposes, that memory cells 510, 512, 513 and 515 (which are connected to wordline WL94) are each to be programmed to a respective one of data states S1-S7; therefore, memory cells 510, 512, 513 and 515 are selected memory cells (labeled sel in FIG. 4G).

FIG. 4H illustrates another memory structure that can be used for the structure 126 of FIG. 1A. FIG. 4H illustrates a three-dimensional vertical cross-point structure, the wordlines still run horizontally, with the bitlines oriented to run in a vertical direction.

FIG. 4H depicts one embodiment of a portion of a monolithic three-dimensional memory array structure 126 that includes a first memory level 402 positioned below a second memory level 401. As depicted, the local bitlines LBL11-LBL33 are arranged in a first direction (e.g., a vertical direction) and the wordlines WL10-WL23 are arranged in a second direction perpendicular to the first direction. This arrangement of vertical bitlines in a monolithic three-dimensional memory array is one embodiment of a vertical bitline memory array. As depicted, disposed between the intersection of each local bitline and each wordline is a particular memory cell (e.g., memory cell M111 is disposed between local bitline LBL11 and wordline WL10). This structure can be used with a number of different memory cell structures. In one example, the particular memory cell may include a floating gate device or a charge trap device (e.g., using a silicon nitride material). In another example, the particular memory cell may include a reversible resistance-switching material, a metal oxide, a phase change memory (PCM) material, or a ReRAM material. The global bitlines GBL1-GBL3 are arranged in a third direction that is perpendicular to both the first direction and the second direction. A set of bitline select devices (e.g., Q11-Q31), such as a vertical thin film transistor (VTFT), may be used to select a set of local bitlines (e.g., LBL11-LBL31). As depicted, bitline select devices Q11-Q31 are used to select the local bitlines LBL11-LBL31 and to connect the local bitlines LBL11-LBL31 to the global bitlines GBL1-GBL3 using row select line SG1. Similarly, bitline select devices Q12-Q32 are used to selectively connect the local bitlines LBL12-LBL32 to the global bitlines GBL1-GBL3 using row select line SG2 and bitline select devices Q13-Q33 are used to selectively connect the local bitlines LBL13-LBL33 to the global bitlines GBL1-GBL3 using row select line SG3.

Referring to FIG. 4H, as only a single bitline select device is used per local bitline, only the voltage of a particular global bitline may be applied to a corresponding local bitline. Therefore, when a first set of local bitlines (e.g., LBL11-LBL31) is biased to the global bitlines GBL1-GBL3, the other local bitlines (e.g., LBL12-LBL32 and LBL13-LBL33) must either also be driven to the same global bitlines GBL1-GBL3 or be floated. In one embodiment, during a memory operation, all local bitlines within the memory array are first biased to an unselected bitline voltage by connecting each of the global bitlines to one or more local bitlines. After the local bitlines are biased to the unselected bitline voltage, then only a first set of local bitlines LBL11-LBL31 are biased to one or more selected bitline voltages via the global bitlines GBL1-GBL3, while the other local bitlines (e.g., LBL12-LBL32 and LBL13-LBL33) are floated. The one or more selected bitline voltages may correspond with, for example, one or more read voltages during a read operation or one or more programming voltages during a programming operation.

Figure 5:
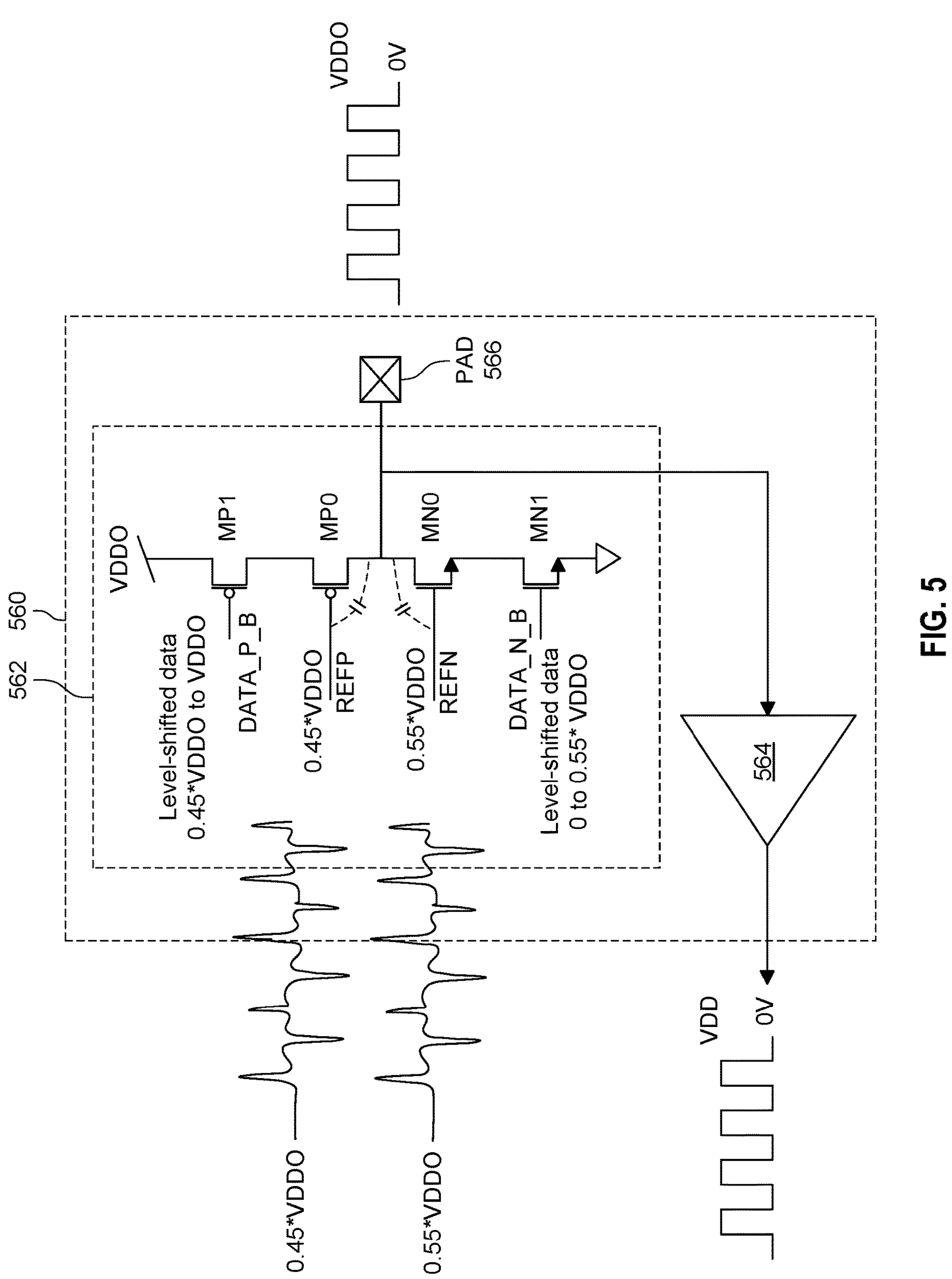
FIG. 5 depicts an example conventional transceiver.

FIG. 5 depicts an example conventional transceiver 560. As depicted, a voltage mode cascoded driver segment 562 may be implemented in transceiver 560. Transceiver 560 may be implemented with one or more of the memory systems described in conjunction with FIGS. 1-4H, although this need not be the case. Here, (conventional) transceiver 560 lacks the reference voltage kickback reduction circuitry of the present technology.

As depicted, transceiver 560 also includes a receiver 564 and an I/O pad 566. I/O pad 566 is electrically connected to both voltage mode cascoded driver segment 562 (which may be associated with a transmitter portion of transceiver 560) and receiver 564.

Transceiver 560 can send and receive signals to and from the outside world via I/O pad 566. For example, when transceiver 560 is transmitting (i.e., in a transmitter mode) voltage mode cascoded driver segment 562 can drive voltage of I/O pad 566 to desired values—thereby transmitting desired signals to the outside world. By contrast, when transceiver 560 is receiving (i.e., in a receiver mode), voltage of I/O pad 566 is driven by external signals received from the outside world. As depicted, I/O pad 566 may be able to receive/transmit signals having voltage between a transceiver supply voltage (VDDO) at maximum, and a ground voltage (i.e., 0 V) at minimum. In 3.3 V tolerant systems, VDDO may be 3.3 V. In 1.8 V tolerant systems, VDDO may be 1.8 V. However, it should be understood that embodiments of the present technology may be implemented in various types of systems having various transceiver supply voltages.

As alluded to above, in certain examples voltage mode cascoded driver segment 562 may be a part of a multi-segment voltage mode cascoded driver. In these examples, the segments of the multi-segment voltage mode cascoded driver may operate in parallel to drive voltage of I/O pad 566 to desired values when transceiver 560 is in a transmitting mode.

As depicted, voltage mode cascoded driver segment 562 includes four MOS devices: MP1, MP0, MN0, and MN1. In various examples, MP1 and MP0 are pull-up MOS devices and MN1 and MN0 are pull-down MOS devices. Accordingly, the branch of voltage mode cascoded driver segment 562 comprising MP1 and MP0 may be referred to as the "pull-up branch" and the branch of voltage mode cascoded driver segment 562 comprising MN1 and MN0 may be referred to as the "pull-down branch."

Referring to the pull-up branch, a source terminal of MP1 is supplied with the transceiver source voltage (VDDO). As alluded to above, VDDO may be the maximum possible voltage I/O pad 566 can transmit/receive—although this need not always be the case. A drain terminal of MP1 is electrically connected to a source terminal of MP0. In turn, a drain terminal of MP0 is electrically connected to I/O pad 566—thereby connecting the pull-up branch of voltage mode cascoded driver segment 562 to I/O pad 566. While not depicted, in various implementations one or more resistors (or other electrical components) may be electrically connected between the drain terminal of MP0 and I/O pad 566. As the term "electrically connected" is used herein, in these implementations the drain terminal of MP0 would still be electrically connected to I/O pad 566 as an electrical current can pass between them.

Referring to the pull-down branch, a source terminal of MN1 is connected to the ground voltage (i.e., 0 V). As alluded to above, the ground voltage may be the minimum possible voltage I/O pad 566 can transmit/receive—although this need not always be the case. A drain terminal of MN1 is electrically connected to a source terminal of MN0. In turn, a drain terminal of MN0 is electrically connected to I/O pad 566—thereby connecting the pull-down branch of voltage mode cascoded driver segment 562 to I/O pad 566. While not depicted, in various implementations one or more resistors (or other electrical components) may be electrically connected between the drain terminal of MN0 and I/O pad 566. As the term "electrically connected" is used herein, in these implementations the drain terminal of MN0 would still be electrically connected to I/O pad 566 as an electrical current can pass between them.

As depicted, MP1, MP0, MN1, and MN0 also have gate terminals. MP1 and MN1 receive data-driven voltage signals DATA_P_B and DATA_N_B respectively at their respective gate terminals (here the data-driven voltage signals may be supplied by a voltage pre-driver which is not depicted for brevity). That is, voltages at the gate terminals of MP1 and MN1 are driven according to signals desired to be transmitted to the outside world via I/O pad 566. By contrast, MP0 and MN0 receive reference voltage signals REFP and REFN at their respective gate terminals (here the reference voltage signals may be supplied by a reference voltage source not depicted for brevity). These reference voltage signals may protect the MOS devices and other components of transceiver 560.

If voltage mode cascoded driver segment 562 is off/inactive, both the pull-up and pull-down branches of voltage mode cascoded driver segment 562 will be off. If voltage mode cascoded driver segment 562 is on/active, one of the pull-up and pull-down branches will be on, while the other branch is off. In general, a branch will be off if at least one of its constituent MOS devices is off. For example, if MP1 is turned off the pull-up branch may be off/inactive. Similarly, if MN1 is off, the pull-down branch may be off/inactive.

When transceiver 560 is in a transmitting mode and voltage mode cascoded driver segment 562 is on (i.e., one of the pull-up and pull-down branches is on), the values of DATA_P_B and DATA_N_B will vary depending on the desired signal to be transmitted via I/O pad 566. For example, if the desired signal to be transmitted is 1, DATA_P_B may be 0.45 VDDO and DATA_N_B may be 0 V. Based on these data-driven signals, MP1 will be on/enabled, while MN1 will be off/disabled. Thus, the pull-up branch will drive voltage of I/O pad 566 to VDDO (i.e., the source voltage supplied at the source terminal of MP1). By contrast, if the desired signal to be transmitted is 0, DATA_P_B may be VDDO and DATA_N_B may be 0.55 VDDO. Based on these data-driven signals, MN1 will be on/enabled, and MP1 will be off/disabled. Thus, the pull-down branch will drive voltage of I/O pad 566 to the value of the ground voltage connected to the source terminal of MN1 (i.e., 0 V).

In the above-described scenarios, reference voltage signals supplied at the gate terminals of MP0 and MN0 function to protect the MOS devices and other components transceiver 560. In typical conventional systems, these reference voltage signals are static values maintained during all operation modes/scenarios. For example, in conventional systems the value of REFP may set to 0.45 VDDO (e.g., the minimum possible value for DATA_P_B) during both transmitter and receiver modes—regardless of contemporaneous DATA_P_B value and/or contemporaneous I/O pad voltage. Relatedly, the value of REFN may be set to 0.55 VDDO (e.g., the maximum possible value for DATA_N_B) in both transmitter and receiver modes—regardless of contemporaneous DATA_N_B value and/or contemporaneous I/O pad voltage. Again, in typical conventional systems reference voltage signals maintain static values during all operation modes/scenarios. Also, as alluded to above, in general the reference voltage signals must operate within a narrow tolerance of their values in order to provide optimal protection.

However (and as alluded to above), reference voltage signals can be disturbed by "voltage kickback" experienced at the reference voltage signal-receiving MOS devices (i.e., MP0 and MN0) of voltage mode cascoded driver segment 562.

For example, when transceiver 560 is in a receiver mode, the voltage of I/O pad 566 may toggle between a maximum voltage (e.g., VDDO) and minimum voltage (e.g., 0 V) in accordance with external voltage signals received via I/O pad 566. This toggling of I/O pad voltage can cause voltage kickback at MP0 and MN0 because of gate—to drain capacitances (Cgd) of MP0 and MN0 (depicted in FIG. 5 with the dashed lines bridging the gate and drain terminals of MP0 and MN0—where the drain terminals of MP0 and MN0 are electrically connected to I/O pad 566). The voltage kickback can disturb the reference voltage signals (e.g., produce noise on REFP and REFN) such that they provide reduced protection for the MOS devices and other components of transceiver 560. With such reduced protection, reliability for transceiver 560 may be reduced. The voltage kickback will also reduce performance for transceiver 560.

As alluded to above, in general, voltage kickback can be reduced by using "strong" voltage sources to supply reference voltage signals (these voltage sources are characterized as "strong" as they have relatively lower impedance as compared to "weak" voltage sources). However, strong voltage sources can be more expensive and difficult to implement in a transceiver than "weak" voltage sources having relatively higher impedance. Moreover, even strong voltage sources are susceptible to voltage kickback.

Accordingly (and as will be described in greater detail in conjunction with FIG. 6), embodiments of the present technology provide transceivers intelligently designed to reduce voltage kickback. In particular, transceivers of the present technology can reduce voltage kickback by dynamically tracking I/O pad voltage of a transceiver (e.g., transceiver 560) at gate terminals of reference voltage signal-receiving MOS devices (e.g., the gate terminals of MP0 and MN0) of a voltage mode cascoded driver segment implemented in the receiver. By tracking I/O pad voltage, embodiments can reduce/avoid rapidly changing voltage differentials across the reference voltage signal-receiving MOS devices—thereby reducing voltage kickback. By reducing voltage kickback, embodiments can improve reliability and performance for transceivers. Tracking I/O pad voltage at the gate terminals of the reference voltage signal-receiving MOS devices can also reduce I/O pad capacitance of the transceivers—thereby improving performance for the transceivers. Moreover, because voltage mode cascoded drivers of the present technology can reduce voltage kickback without relying on strong voltage sources, embodiments may be cheaper and easier to implement than existing voltage kickback-reducing technologies.

Figure 6:
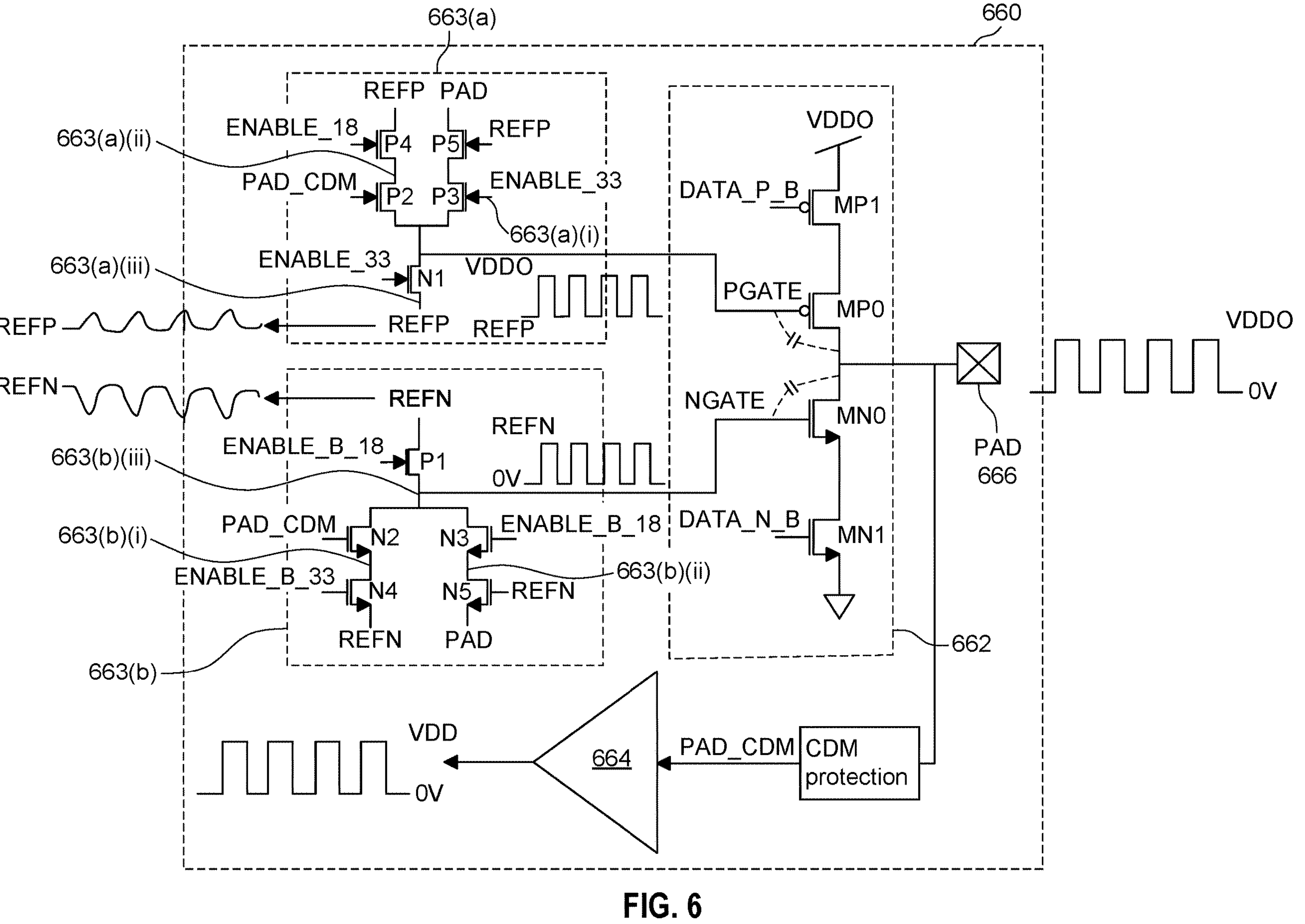
FIG. 6 depicts an example transceiver, in accordance with the present technology.

FIG. 6 depicts an example transceiver 660, in accordance with the present technology.

FIG. 7 is a companion figure to FIG. 6. Namely, FIG. 7 depicts an example table displaying example values for enable voltage signals supplied to gate terminals of pull-up and pull-down transistors of the reference voltage kickback reduction circuits depicted in FIG. 6.

As depicted in FIG. 6, a voltage mode cascoded driver segment 662 may be implemented in a transceiver 660. Voltage mode cascoded driver segment 662 and transceiver 660 may be implemented with one or more of the memory systems described in conjunction with FIGS. 1-4H, although this need not be the case. As depicted, (and as will be described in greater detail below) voltage mode cascoded driver segment 662 includes example reference voltage kickback reduction circuitry in accordance with the present technology.

Transceiver 660 may be the same/similar as transceiver 560 described in conjunction with FIG. 5—except that transceiver 660 adds reference voltage kickback reduction circuits 663(*a*) and 663(*b*).

Here, it should be understood that the reference voltage kickback reduction circuits of the present technology can be implemented with different transceiver architectures, and that FIGS. 5-6 merely depict example transceiver architectures. For example, the same/similar reference voltage kickback reduction principles described herein may be applied in a transceiver implemented using a non-stacked/non-cascoded voltage mode driver where e.g., a MOS device of the non-stacked/non-cascoded voltage mode driver receives data-driven voltage signals during transmitter modes and protective/reference voltage signals during receiver modes. Accordingly, in these implementations, the principles described herein may be used to track I/O pad voltage at a gate terminal of the MOS device when the transceiver is in the receiver mode. Such I/O pad voltage tracking may reduce capacitance of the I/O pad, thereby improving performance for the transceiver.

It should also be understood that reference voltage kickback reduction circuits 663(*a*) and 663(*b*) merely depict illustrative examples, and that other reference voltage kickback reduction circuit architectures may be used to implement the principles discussed herein.

Namely, embodiments of the present technology provide transceivers intelligently designed to reduce voltage kickback. In particular transceivers of the present technology can reduce voltage kickback by dynamically tracking I/O pad voltage of a transceiver (e.g., transceiver 660) at gate terminals of reference voltage signal-receiving MOS devices (e.g., MP0 and MN0) of a voltage mode cascoded driver segment (e.g., voltage mode cascoded driver segment 662). By tracking I/O pad voltage, embodiments can reduce/avoid rapidly changing voltage differentials across the reference voltage signal-receiving MOS devices—thereby reducing voltage kickback. By reducing voltage kickback, embodiments can maintain reliability and improve performance for transceivers. Moreover, because transceivers of the present technology can reduce voltage kickback without relying on strong voltage sources, embodiments may be cheaper and achieve smaller footprints than existing voltage kickback-reducing technologies. In addition, by tracking I/O pad voltage at the gate terminals of the reference voltage signal-receiving MOS devices can also reduce I/O pad capacitance—thereby further improving transceiver performance.

In various examples (and as depicted in FIG. 6), a transceiver (e.g., transceiver 660) of the present technology may comprise: (1) a first reference voltage kickback reduction circuit (e.g., reference voltage kickback reduction circuit 663(*a*)) electrically connected to a gate terminal of a first reference voltage signal-receiving MOS device (e.g., a gate terminal of MP0—referred to herein as the P-gate) such that the first reference voltage kickback reduction circuit supplies a first reference voltage signal to the gate terminal of the first reference voltage signal-receiving MOS device; and (2) a second reference voltage kickback reduction circuit (e.g., reference voltage kickback reduction circuit 663(*b*)) electrically connected to a gate terminal of a second reference voltage signal-receiving MOS device (e.g., a gate terminal of MN0-referred to herein as the N-gate) such that the second reference voltage kickback reduction circuit supplies a second reference voltage signal to the gate terminal of the second reference voltage signal-receiving MOS device. The first and second reference voltage signal-receiving MOS devices may be electrically connected to an I/O pad (e.g., I/O pad 666) of the transceiver via drain terminals of the first and second reference voltage signal-receiving MOS devices respectively. Operation and design of the example reference voltage kickback reduction circuits depicted in FIG. 6 follow.

Operation During Receiver Vs. Transmitter Modes

As alluded to above, reference voltage kickback reduction circuits 663(*a*) and 663(*b*) may operate differently (i.e., supply different reference voltage signals) depending on whether transceiver 660 is operating in a receiver mode (i.e., when transceiver 660 is receiving signals from the outside world) vs. a transmitter mode (i.e., when transceiver 660 is transmitting signals to the outside world). Namely when transceiver 660 is in a receiver mode, reference voltage kickback reduction circuits 663(*a*) and 663(*b*) may drive reference voltage signals to dynamically track toggling voltage of I/O pad 666—thereby reducing voltage kickback at the gate terminals of MP0 and MN0 (referred to herein as the P-gate and N-gate respectively). By contrast, when transceiver 660 is in a transmitter mode, reference voltage kickback reduction circuits 663(*a*) and 663(*b*) may supply non-I/O pad voltage-dependent reference voltage signals (i.e., reference signals which do not track toggling voltage of I/O pad 666) in the same/similar manner as a conventional transceiver (e.g., transceiver 560) would during a transmitter mode. This operational difference is designed in appreciation of an insight that in general, voltage kickback is significantly more pronounced (if unchecked) when a transceiver is in a receiver mode. Accordingly, the reference voltage kickback reduction circuits of the present technology are intelligently designed to operate in the same/similar manner as a conventional transceivers during transmitter modes. For example, during transmitter modes reference voltage kickback reduction circuits 663(*a*) and 663(*b*) may simply pass/transmit "pre-reference" voltage signals (e.g., REFP and REFN) supplied by a separate/upstream "pre-reference" voltage supply source (see FIG. 8 for an example pre-reference voltage supply circuit). By contrast, when transceiver 660 is in a receiver mode and voltage kickback reduction is (more) required, reference voltage kickback reduction circuits 663(*a*) and 663(*b*) ensure that the reference voltages supplied to P- and N-gates respectively dynamically track voltage of I/O pad 666—thereby reducing voltage kickback at the P- and N-gates.

In various implementations, voltage mode cascoded driver segment 662 may be a segment of a multi-segment voltage mode cascoded driver implemented in transceiver 660. During transmitter modes, some segments of the multi-segment voltage mode cascoded driver may be active while voltage mode cascoded driver segment 662 is inactive. In such a scenario, although inactive, voltage mode cascoded driver segment 662 may still receive reference voltage signals at the P- and N-gates. As embodiments of the present technology are designed in appreciation of, in such scenarios the risk of voltage kickback at the P- and N-gates may be the same/similar as when transceiver 660 is a receiver mode. Accordingly, in situations where transceiver 660 is in a transmitter mode and voltage mode cascoded driver segment 662 is inactive, reference voltage kickback reduction circuits 663(*a*) and 663(*b*) may drive reference voltage signals to dynamically track voltage of I/O pad 666 in the same/similar manner as when transceiver 660 is in a receiver mode.

"Tracking" I/O Pad Voltage

As alluded to above, when transceiver 660 is in a receiver mode (or when transceiver 660 is in a transmitter mode and voltage mode cascoded driver segment 662 is inactive), reference voltage kickback reduction circuits 663(*a*) and 663(*b*) can drive reference voltage signals to dynamically track voltage of I/O pad 666. Such "tracking" may take different forms depending on application.

For example, as embodiments of the present technology are designed in appreciation of, implementations of transceiver 660 using low voltage-tolerant devices may require "partially tracking" I/O pad 666 voltage instead of "fully tracking" voltage of/O pad 666 voltage to maintain reliability. That is, in implementations of transceiver 660 using low voltage-tolerant devices, tracking I/O pad 666 voltage all the way to maximum and minimum values at the P- and N-gates would cause reliability concerns—which can be mitigated through strategic "partial" tracking. For example (and as depicted), reference voltage kickback reduction circuit 663(*a*) can drive the reference voltage signal supplied to the P-gate to the voltage of I/O pad 666 when voltage of I/O pad 666 is maximum. By contrast, when voltage of I/O pad 666 is minimum, reference voltage kickback reduction circuit 663(*a*) can drive the reference voltage signal supplied to the P-gate to a first pre-reference voltage (i.e., REFP). Here, REFP may be less than the transceiver supply voltage (VDDO) and greater than the ground voltage (i.e., 0 V). For example, REFP may be 0.45 VDDO. In these implementations, reference voltage kickback reduction circuit 663(*b*) may drive the reference voltage signal supplied to the N-gate to a second pre-reference voltage (i.e., REFN) when the voltage of I/O pad 666 is maximum (as alluded to above, in certain implementations the maximum voltage of I/O pad 666 may be VDDO—although this need not be the case). By contrast, when voltage of I/O pad 666 is minimum (as alluded to above, in certain implementations the minimum voltage of I/O pad 666 may be the ground voltage—although this need not be the case), reference voltage kickback reduction circuit 663(*b*) can drive the reference voltage signal supplied to the N-gate to the voltage of I/O pad 666. Here, REFN may also be less than VDDO and greater than the ground voltage (i.e., 0 V). For example, REFN may be 0.55 VDDO (in these examples it may be noted that REFN may be greater than REFP which is 0.45 VDDO). Accordingly, reference voltage kickback reduction circuit 663(*a*) can drive the reference voltage signal supplied to the P-gate to track voltage of I/O pad 666 between the maximum voltage of I/O pad 666 (e.g., VDDO) and REFP (e.g., 0.45 VDDO)—where REFP is less than VDDO and greater than the ground voltage (i.e., 0 V). Relatedly, reference voltage kickback reduction circuit 663(*b*) can drive the reference voltage signal supplied to the N-gate to track voltage of I/O pad 666 between REFN (e.g., 0.55 VDDO) and the ground voltage (i.e., 0 V)—where REFN is also less than VDDO and greater than the ground voltage (i.e., 0 V). In this way, the reference voltage signals supplied to the P- and N-gates "partially" track voltage of I/O pad 666. As alluded to above, by partially tracking I/O pad voltage instead of fully tracking I/O pad voltage, embodiments can enable transceiver implementations utilizing low voltage-tolerant devices. However, in transceiver implementations utilizing higher voltage-tolerant devices, embodiments may fully track I/O pad voltage. That is, the reference voltage kickback reduction circuits can drive the reference voltage signals supplied to the P- and N-gates to track voltage of I/O pad 666 between the maximum voltage of I/O pad 666 (e.g., VDDO) and the minimum voltage of I/O pad 666 (e.g., 0 V).

In embodiments utilizing the above-described partial tracking, values for REFP and REFN (i.e., the first and second pre-reference voltages respectively) may be strategically selected to maintain reliability and improve performance. For example, the values may be selected to maximize source-to-gate voltages for the P- and N-gates without exceeding reliability limits. Alternatively, these values can be set to provide greater margin for reliability by reducing the maximum source-to-gate voltages at the P- and N-gates. In accordance with the insights above, the first and second pre-reference voltages may be set to e.g., 0.45×VDDO for the first pre-reference voltage and 0.55×VDDO for the second pre-reference voltage.

Reference Voltage Kickback Reduction Circuit Design

As alluded to above, the reference voltage kickback reduction circuits of the present technology (e.g., reference voltage kickback reduction circuits 663(*a*) and 663(*b*)) can be intelligently designed to (1) operate differently (i.e., supply different reference voltage signals) depending on whether a transceiver is operating in a receiver mode vs. a transmitter mode; and (2) partially track I/O pad voltage when the transceiver is in a receiver mode (or when the transceiver is in the transmitter mode and some segments of a voltage mode cascoded driver implemented in the transceiver are inactive).

As will be described in greater detail below, there are various strategic design features that enable the above-described functionality.

For instance (and as depicted), reference voltage kickback reduction circuits 663(*a*) and 663(*b*) may each comprise three sub-circuits responsible for driving reference voltage signals in different scenarios.

For example (and as depicted), reference voltage kickback reduction circuit 663(*a*) circuit may comprise a first sub-circuit (i.e., sub-circuit 663(*a*)(*i*)), a second sub-circuit (i.e., sub-circuit 663(*a*)(*ii*)), and a third sub-circuit (i.e., sub-circuit 663(*a*)(*iii*)) electrically connected to each other in parallel. Sub-circuit 663(*a*)(*i*) may drive the reference voltage signal supplied to the P-gate when transceiver 660 is in a receiver mode and voltage of I/O pad 666 is maximum. Sub-circuit 663(*a*)(*ii*) may drive the reference voltage signal supplied to the P-gate when transceiver 660 is in the receiver mode and voltage of I/O pad 666 is minimum. Sub-circuit 663(*a*)(*iii*) may drive the reference voltage signal supplied to the P-gate when transceiver 660 is in a transmitter mode. In the above-described "partial" tracking implementations, sub-circuit 663(*a*)(*i*) may drive the reference voltage signal supplied to the P-gate to the voltage of I/O pad 666 when transceiver 660 is in a receiver mode and voltage of I/O pad 666 is maximum. Relatedly, sub-circuit 663(*a*)(*ii*) may drive the reference voltage signal supplied to the P-gate to REFP when transceiver 660 is in the receiver mode and voltage of I/O pad 666 is minimum.

As depicted, reference voltage kickback reduction circuit 663(*b*) circuit may comprise a fourth sub-circuit (i.e., sub-circuit 663(*b*)(*i*)), a fifth sub-circuit (i.e., sub-circuit 663(*b*)(*ii*)), and a sixth sub-circuit (i.e., sub-circuit 663(*b*)(*iii*)) electrically connected to each other in parallel. Sub-circuit 663(*b*)(*i*) may drive the reference voltage signal supplied to the N-gate when transceiver 660 is in a receiver mode and voltage of I/O pad 666 is maximum. Sub-circuit 663(*b*)(*ii*) may drive the reference voltage signal supplied to the N-gate when transceiver 660 is in the receiver mode and voltage of I/O pad 666 is minimum. Sub-circuit 663(*b*)(*iii*) may drive the reference voltage signal supplied to the N-gate when transceiver 660 is in a transmitter mode. In the above-described "partial" tracking implementations, sub-circuit 663(*b*)(*i*) may drive the reference voltage signal supplied to the N-gate to REFN when transceiver 660 is in a receiver mode and voltage of I/O pad 666 is maximum. Relatedly, sub-circuit 663(*a*)(*ii*) may drive the reference voltage signal supplied to the N-gate to the voltage of I/O pad 666 when transceiver 660 is in the receiver mode and voltage of I/O pad 666 is minimum.

As depicted, in various embodiments the present technology can leverage pull-up and pull-down logic/transistors to implement the above-described functionalities. As used herein a pull-up transistor may be a transistor (or similar device) that is turned on/enabled when voltage at its source terminal is greater than an enable voltage signal supplied at its gate terminal by a pre-determined threshold voltage. The pull-up transistor may be turned off/disabled when voltage at its source terminal is less than or equal to the enable voltage signal supplied at its gate terminal. As used herein a pull-down transistor may be a transistor (or similar device) that is turned on/enabled when voltage at its supply is less than an enable voltage signal supplied at its gate terminal by a pre-determined threshold. The pull-down transistor may be turned off/disabled when voltage at its source terminal is greater than or equal to the enable voltage signal supplied at its gate terminal.

As alluded to above, FIG. 7 depicts an example table displaying example values for enable voltage signals supplied to gate terminals of pull-up and pull-down transistors of the reference voltage kickback reduction circuits depicted in FIG. 6. Namely, FIG. 7 depicts example values for: ENABLE_18 (supplied to the gate terminal of pull-up transistor P4); ENABLE_33 (supplied to the gate terminals of pull-up transistor P3 and pull-down transistor N1); ENABLE_B_18 (supplied to the gate terminals of pull-up transistor P1 and pull-down transistor N3); and ENABLE_B_33 (supplied to the gate terminal of pull-down transistor N4). As depicted, the value of enable voltage signals ENABLE_18, ENABLE_B_18, ENABLE_33, and ENABLE_B_33 may change based on whether transceiver 660 is in a receiver mode vs. a transmitter mode. By contrast (and as depicted in FIG. 6), the enable voltage signals supplied to pull-up transistor P5 (e.g., REFP), pull-up transistor P2 (e.g., PAD_CDM—i.e., a CDM protected I/O pad voltage), pull-down transistor N2 (e.g., PAD_CDM) and pull-down transistor N5 (e.g., REFN) may be the same in both receiver and transmitter modes (to be clear, the values of PAD-CDM may change based on toggling voltage of I/O pad 666). Operation of these enable voltage signals and the pull-up and pull-down transistors to which they are supplied is described in greater detail below.

As depicted, sub-circuit 663(*a*)(*i*) may comprise a first pull-up transistor (i.e., P5) and a second pull-up transistor (i.e., P3). A source terminal of P5 may be supplied with the (contemporaneous) voltage of I/O pad 666. A drain terminal of P5 may be electrically connected to a source terminal of P3. Accordingly, the source terminal of P3 may effectively be supplied with the (contemporaneous) voltage of I/O pad 666 as well. A drain terminal of P3 may be electrically connected to the gate terminal of MP0 (i.e., the P-gate). As alluded to above, MP0 may be a pull-up MOS device. Given this construction, the gate terminals of P5 and P3 may be strategically supplied with enable voltage signals that ensure sub-circuit 663(*a*)(*i*) drives the reference voltage signal supplied to the P-gate to voltage of I/O pad 666 when transceiver 660 is in the receiver mode and voltage of I/O pad 666 is maximum. By contrast, sub-circuit 663(*a*)(*i*) may not drive the reference voltage signal supplied to the P-gate when transceiver 660 is in the receiver mode and voltage of I/O pad 666 is minimum and/or when transceiver 660 is in the transmitter mode. For example, when transceiver 660 is in the receiver mode (e.g., where ENABLE_33=REFP) the gate terminals of P5 and P3 may be supplied with REFP (e.g., 0.45 VDDO)—which as described above will be less than VDDO and greater than the ground voltage (i.e., 0 V). Accordingly, when voltage of I/O pad 666 is maximum (i.e., greater than REFP supplied at the gate terminals of P5 and P3), P5 and P3 may be enabled—thereby ensuring that the (maximum) voltage of I/O pad 666 supplied at the source terminal of P5 is effectively translated to the P-gate. By contrast, when voltage of I/O pad 666 is minimum (i.e., less than REFP supplied at the gate terminals of P5 and P3), P5 and P3 may be disabled—thereby effectively de-activating sub-circuit 663(*a*)(*i*) from driving the reference voltage signal supplied to the P-gate. Relatedly, when transceiver 660 is in a transmitter mode (e.g., where ENABLE_33=VDDO) the voltage supplied to the gate terminal of P3 may be VDDO (which is always greater than or equal to the contemporaneous voltage of I/O pad 666 supplied at the source terminal of P5) which ensures that P3 is always disabled—thereby effectively de-activating sub-circuit 663(*a*)(*i*) from driving the reference voltage signal supplied to the P-gate when transceiver 660 is in the transmitter mode.

Sub-circuit 663(*a*)(*ii*) may be structured similarly to sub-circuit 663(*a*)(*i*). For example, sub-circuit 663(*a*)(*ii*) may comprise a third pull-up transistor (i.e., P4) and a fourth pull-up transistor (i.e., P2). A source terminal of P4 may be supplied with REFP (e.g., 0.45 VDDO). A drain terminal of P4 may be electrically connected to a source terminal of P2. Accordingly, the source terminal of P2 may effectively be supplied with REFP. A drain terminal of P2 may be electrically connected to the gate terminal of the MP0 (i.e., the P-gate). Given this construction, gate terminals of P4 and P2 may be strategically supplied with enable voltage signals that ensure sub-circuit 663(*a*)(*ii*) drives the reference voltage signal supplied to the P-gate to REFP (e.g., 0.45 VDDO) when transceiver 660 is in the receiver mode and voltage of I/O pad 666 is minimum. By contrast, sub-circuit 663(*a*)(*ii*) may not drive the reference voltage signal supplied to the P-gate when transceiver 660 is in the receiver mode and voltage of I/O pad 666 is maximum and/or when transceiver 660 is in the transmitter mode. For example, when transceiver 660 is in the receiver mode (e.g., where ENABLE_18=the ground voltage) the gate terminal of P4 may be supplied with the ground voltage (i.e., 0 V—which is less than REFP supplied at the source terminal of P4) and the gate terminal of P2 may be supplied the (contemporaneous) voltage of I/O pad 666 (which may be greater than or less than REFP depending on whether voltage of I/O pad 666 is minimum or maximum). Accordingly, when voltage of I/O pad 666 is minimum (i.e., less than REFP supplied at the source terminal of the P4), P4 and P2 may be enabled—thereby ensuring that REFP (e.g., 0.45 VDDO) supplied at the source terminal of P4 is effectively translated to the P-gate. By contrast, when voltage of I/O pad 666 is maximum (i.e., greater than REFP supplied at the source terminal of P4), at least P2 may be disabled—thereby effectively de-activating sub-circuit 663(*a*)(*ii*) from driving the reference voltage signal supplied to the P-gate. Relatedly, when transceiver 660 is in a transmitter mode (e.g., where ENABLE_18=REFN) the voltage supplied to the gate terminal of P4 may be REFN (e.g., 0.55 VDDO). As alluded to above, REFN may be set to be greater than or equal to REFP supplied at the source terminal of P4. This ensures that P4 is always disabled in transmitter modes—thereby effectively de-activating sub-circuit 663(*a*)(*ii*) from driving the reference voltage signal supplied to the P-gate when transceiver 660 is in a transmitter mode.

Sub-circuit 663(*a*)(*iii*) may be structured somewhat differently than sub-circuits 663(*a*) and 663(*a*)(*ii*). For example (and as depicted), sub-circuit 663(*a*)(*iii*) may comprise a pull-down transistor (i.e., N1). A source terminal of N1 may be supplied with REFP (e.g., 0.45 VDDO). A drain terminal of N1 may be electrically connected to the gate terminal of MP0 (i.e., the P-gate). Given this construction, the gate terminal of N1 may be strategically supplied with enable voltage signals that ensure sub-circuit 663(*a*)(*iii*) drives the reference signal supplied to the P-gate to REFP when transceiver 660 is in the transmitter mode. By contrast, sub-circuit 663(*a*)(*iii*) may not drive the reference signal supplied to the P-gate when voltage mode cascoded driver segment 662 is in the receiver mode. For example, when transceiver 660 is in the transmitter mode (e.g., where ENABLE_33=VDDO) the voltage supplied at the gate terminal of N1 may be VDDO (which is greater than REFP supplied at the source terminal of N1) such that N1 is always enabled in the transmitter mode. This ensures that REFP supplied at the source terminal of N1 is effectively translated to the P-gate when transceiver 660 is in the transmitter mode. By contrast, when transceiver 660 is in the receiver mode (e.g., where ENABLE_33=REFP) the voltage supplied at the gate terminal of N1 may be REFP (which is equivalent to REFP supplied at the source terminal of N1) such that N1 is always disabled in the receiver mode—thereby effectively de-activating sub-circuit 663(*a*)(*iii*) from driving the reference voltage signal supplied to the P-gate when transceiver 660 is in the receiver mode.

Regarding transitions between maximum and minimum voltages of I/O pad 666 when transceiver 660 is in a receiver mode, when I/O pad 666 voltage falls from VDDO to the ground voltage (i.e., 0 V), P3 and P5 of sub-circuit 663(*a*)(*i*) may start to turn off while P2 and P4 of sub-circuit 663(*a*)(*ii*) start to turn on—thus transitioning voltage supplied to the P-gate from VDDO to REFP (i.e., partially following I/O pad 666 voltage from VDDO to REFP). By contrast, when I/O pad 666 voltage rises from the ground voltage (i.e., 0 V) to VDDO, P2 and P4 of sub-circuit 663(*a*)(*ii*) may start to turn off while P3 and P5 (of sub-circuit 663(*a*)(*i*)) start to turn on—thus transitioning voltage supplied to the P-gate REFP to VDDO (i.e., partially following I/O pad 666 voltage after I/O pad 666 voltage passes REFP).

Here, the sub-circuits of reference voltage kickback reduction circuit 663(*b*) may be structured similarly to the sub-circuits of reference voltage kickback reduction circuit 663(*a*) respectively. However, where sub-circuits 663(*a*)(*i*) and sub-circuit 663(*a*)(*ii*) utilize pull-up logic/pull-up transistors, sub-circuits 663(*b*)(*i*) and sub-circuit 663(*b*)(*ii*) may utilize pull-down logic/pull-down transistors. Similarly, where sub-circuit 663(*a*)(*iii*) utilizes pull-down logic/a pull-down transistor, sub-circuit 663(*b*)(*iii*) may utilize pull-up logic/a pull-up transistor. Relatedly (and as alluded to above), MN0 may be a pull-down MOS device.

For example, sub-circuit 663(*b*)(*i*) may comprise a second pull-down transistor (i.e., N4) and a third pull-down transistor (i.e., N2). A source terminal of N4 may be supplied with REFN (e.g., 0.55 VDDO). A drain terminal of N4 may be electrically connected to a source terminal of N2. Accordingly, the source terminal of N2 may effectively be supplied with REFN. A drain terminal N2 may be electrically connected to the gate terminal of MN0 (i.e., the N-gate). As alluded to above, MN0 may be a pull-down MOS device. Given this construction, the gate terminals of N4 and N2 may be strategically supplied with enable voltage signals that ensure sub-circuit 663(*b*)(*i*) drives the reference voltage signal supplied to the N-gate to REFN (e.g., 0.55 VDDO) when transceiver 660 is in the receiver mode and voltage of I/O pad 666 is maximum. By contrast, sub-circuit 663(*b*)(*i*) may not drive the reference voltage signal supplied to the N-gate when transceiver 660 is in the receiver mode and voltage of I/O pad 666 is minimum and/or when transceiver 660 is in the transmitter mode. For example, when transceiver 660 is in the receiver mode (e.g., where ENABLE_B_33=VDDO) N4 may be supplied with VDDO and N2 may be supplied with the (contemporaneous) voltage of I/O pad 666. Accordingly, when voltage of I/O pad 666 is maximum, the voltages supplied at the gate terminals of N4 and N2 will be greater than REFN supplied at the source terminal of N4 meaning that N4 and N2 will be enabled—thereby ensuring that REFN supplied at the source terminal of N4 is effectively translated to the N-gate. By contrast, when voltage of I/O pad 666 is minimum (e.g., 0 V), the voltage supplied at the gate terminal of N2 (i.e., the minimum voltage of I/O pad 666) will be less than REFN supplied at the source terminal of N4 meaning that N2 will be off/disabled—thereby effectively de-activating sub-circuit 663(*b*)(*i*) from driving the reference voltage signal supplied to the N-gate. Relatedly, when voltage mode cascoded driver segment 662 is in a transmitter mode (e.g., where ENABLE_B_33=REFP) the voltage supplied to the gate terminal of N4 may be REFP (e.g., 0.45 VDDO). As described above, REFP may be set to be less than or equal to REFN supplied at the source terminal of N4. Such setting can ensure that N4 is always disabled in transmitter modes—thereby effectively de-activating sub-circuit 663(*b*)(*i*) from driving the reference voltage signal supplied to the N-gate when transceiver 660 is in a transmitter mode.

Sub-circuit 663(*b*)(*ii*) may be structured similarly to sub-circuit 663(*b*)(*i*). For example, sub-circuit 663(*b*)(*ii*) may comprise a fourth pull-down transistor (i.e., N5) and a fifth pull-down transistor (i.e., N3). A source terminal of N5 may be supplied with the (contemporaneous) voltage of I/O pad 666. A drain terminal of N5 may be electrically connected to a source terminal of N3. Accordingly, the source terminal of N3 may effectively be supplied with the (contemporaneous) voltage of I/O pad 666. A drain terminal of N3 may be electrically connected to the gate terminal of the MN0 (i.e., the N-gate). Given this construction, gate terminals of N5 and N3 may be strategically supplied with enable voltage signals that ensure sub-circuit 663(*b*)(*ii*) drives the reference voltage signal supplied to the N-gate to voltage of I/O pad 666 when transceiver 660 is in the receiver mode and voltage of I/O pad 666 is minimum. By contrast, sub-circuit 663(*b*)(*ii*) may not drive the reference voltage signal supplied to the N-gate when transceiver 660 is in the receiver mode and voltage of I/O pad 666 is maximum and/or when transceiver 660 is in the transmitter mode. For example, when transceiver 660 is in the receiver mode (e.g., where ENABLE_B_18=REFN) the gate terminals of N5 and N3 may be supplied with the REFN (e.g., 0.55 VDDO). Accordingly, when voltage of I/O pad 666 is minimum (e.g., 0 V), REFN (e.g., 0.55 VDDO) supplied at the gate terminals of N5 and N3 will exceed the (minimum) voltage of I/O pad 666 supplied at the source terminal of N5 such that N5 and N3 are enabled—thereby ensuring that the (minimum) voltage of I/O pad 666 is effectively translated to the N-gate. By contrast, when voltage of I/O pad 666 is maximum (e.g., VDDO), REFN (e.g., 0.55 VDDO) supplied at the gate terminals of N5 and N3 will be less than the (maximum) voltage of I/O pad 666 supplied at the source terminal of N5 such that N5 and N3 are disabled—thereby effectively de-activating sub-circuit 663(*b*)(*ii*) from driving the reference voltage signal supplied to the N-gate. Relatedly, when voltage mode cascoded driver segment 662 is in a transmitter mode (e.g., where ENABLE_B_18=the ground voltage) the voltage supplied to the gate terminal of N3 may be the ground voltage (i.e., 0 V). Accordingly, voltage at the gate terminal of N3 may always be less than or equal to the (contemporaneous) voltage of I/O pad 666 supplied at the source terminal of N5 such that N3 is always disabled in transmitter modes—thereby effectively de-activating sub-circuit 663(*b*)(*ii*) from driving the reference voltage signal supplied to the N-gate when transceiver 660 is in a transmitter mode.

Sub-circuit 663(*b*)(*iii*) may be structured somewhat differently than sub-circuits 663(*b*) and 663(*b*)(*ii*). For example (and as depicted), sub-circuit 663(*b*)(*iii*) may comprise a fifth pull-up transistor (i.e., P1). A source terminal of P1 may be supplied with REFN (e.g., 0.55 VDDO). A drain terminal of P1 may be electrically connected to the gate terminal of MN0 (i.e., the N-gate). Given this construction, the gate terminal of P1 may be strategically supplied with enable voltage signals that ensure sub-circuit 663(*b*)(*iii*) drives the reference signal supplied to the N-gate to REFN when transceiver 660 is in the transmitter mode. By contrast, sub-circuit 663(*b*)(*iii*) may not drive the reference signal supplied to the N-gate when transceiver 660 is in the receiver mode. For example, transceiver 660 is in the transmitter mode (e.g., where ENABLE_B_18=the ground voltage) the voltage supplied at the gate terminal of P1 may be supplied with the ground voltage (i.e., 0 V). As the ground voltage (i.e., 0 V) is lower than REFN (e.g., 0.55 VDDO), P1 may always be enabled in transmitter modes—thereby ensuring that REFN supplied at the source terminal of P1 is effectively translated to the N-gate when transceiver 660 is in the transmitter mode. By contrast, when transceiver 660 is in the receiver mode (e.g., e.g., where ENABLE_B_18=REFN) the voltage supplied at the gate terminal of P1 may be REFN which is equivalent to REFN supplied at the source terminal of P1. Accordingly, P1 may always be disabled in receiver modes —thereby effectively de-activating sub-circuit 663(*b*)(*iii*) from driving the reference voltage signal supplied to the N-gate when transceiver 660 is in the receiver mode.

Regarding transitions between maximum and minimum voltages of I/O pad 666 when transceiver 660 is in a receiver mode, when I/O pad 666 voltage falls from VDDO to the ground voltage (i.e., 0 V), N2 and N4 of sub-circuit 663(*b*)(*i*) will may start to turn off while N3 and N5 of sub-circuit 663(*b*)(*ii*) start to turn on—thus transitioning voltage supplied to the N-gate from REFN to the ground voltage (i.e., partially following I/O pad 666 voltage after I/O pad 666 voltage passes REFN). By contrast, when I/O pad 666 voltage rises from the ground voltage (i.e., 0 V) to VDDO, N3 and N5 of sub-circuit 663(*b*)(*ii*) may start to turn off while N2 and N4 of sub-circuit 663(*b*)(*i*) start to turn on—thus transitioning voltage supplied to the N-gate from the ground voltage (i.e., 0 V) to REFN (i.e., partially following I/O pad 666 voltage until REFN).

Figure 8:
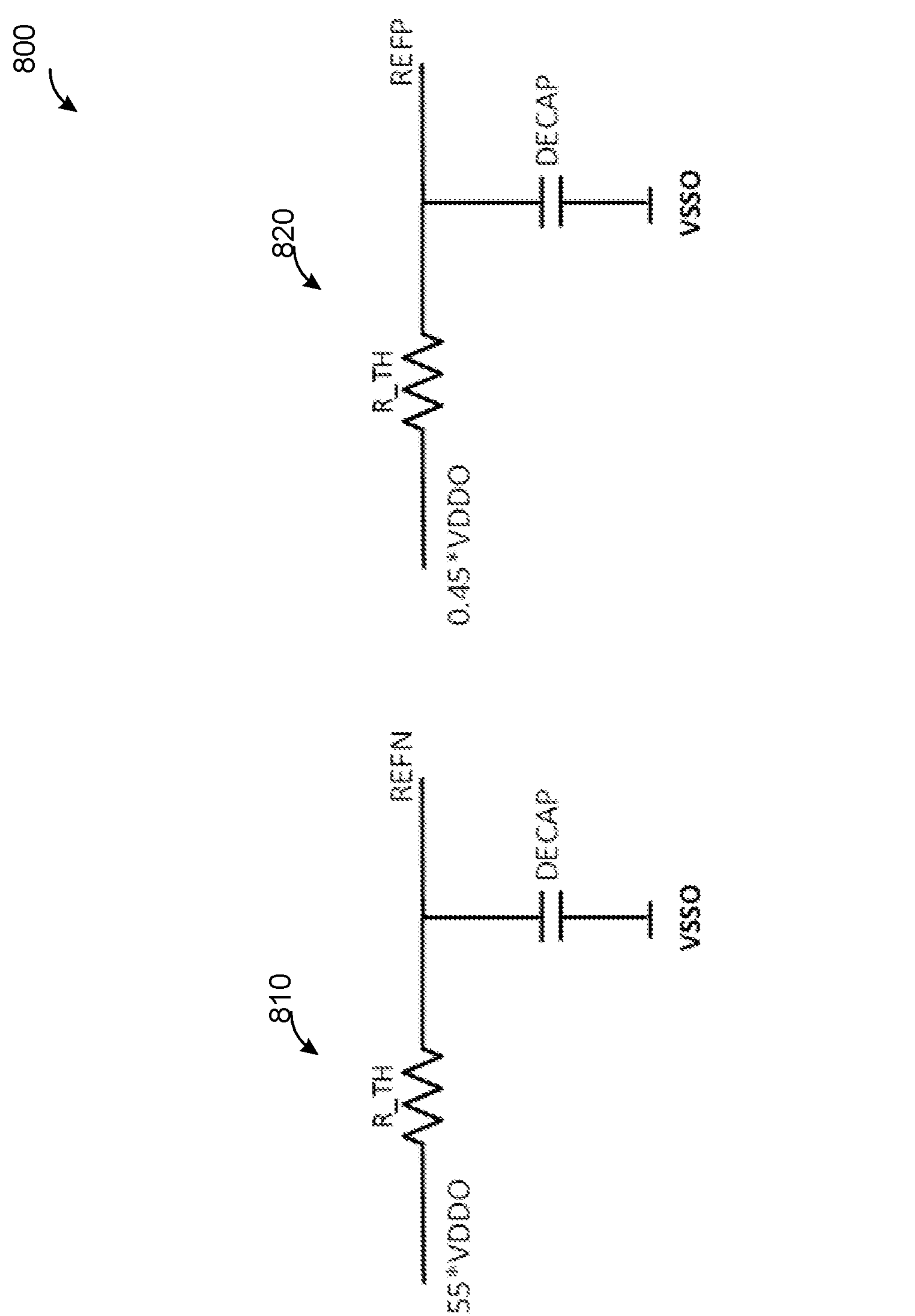
FIG. 8 illustrates an example pre-reference voltage supply circuit, in accordance with the present technology.

FIG. 8 illustrates an example pre-reference voltage supply circuit 800, in accordance with the present technology. Here, pre-reference voltage supply circuit 800 may be a "weak" voltage supply circuit which can be cheaper and easier to implement in a transceiver (e.g., transceiver 660) as compared to "strong" voltage supply circuits which are generally more expensive and require larger footprints. As alluded to above, because embodiments of the present technology can reduce reference voltage kickback without relying on "strong" voltage supply circuits (i.e., voltage supply circuits having relatively lower impedance as compared to "weak" voltage supply circuits), embodiments can reduce costs and footprints for transceivers.

As depicted, sub-circuit 820 of pre-reference voltage supply circuit 800 may generate/supply a first pre-reference voltage (e.g., REFP). Sub-circuit 810 of pre-reference voltage supply circuit 800 may supply a second pre-reference voltage (e.g., REFN). R_TH may be a resistor (e.g., with a resistance of 15KΩ). DECAP may be a capacitor (e.g., with a capacitance of e.g., 8 pF).

Figure 9:
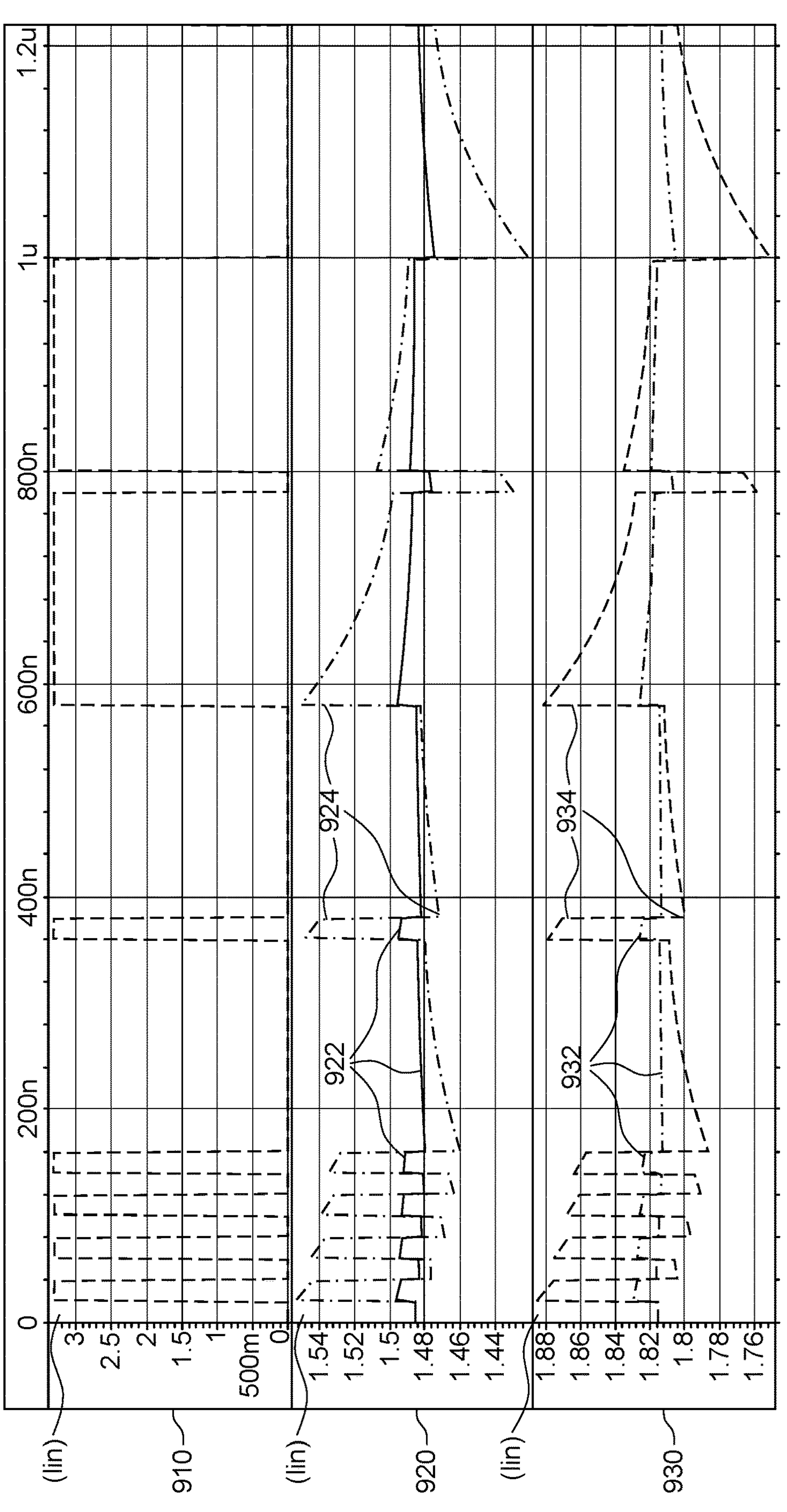
FIG. 9 illustrates example experimental results comparing reference voltage kickback for an example conventional transceiver vs. an example transceiver of the present technology.

FIGS. 9 and 10 illustrate example experimental results comparing reference voltage kickback and I/O pad capacitances for a conventional transceiver vs. a transceiver of the present technology. Such data was compiled when the respective transceivers were operating in receiving modes.

FIG. 9 includes three plots. Plot 910 illustrates toggling voltage of an I/O pad obtained during the example experiments. As can be seen, I/O pad voltage generally toggled between a maximum value and a minimum value in an approximate square wave pattern.

Plot 920 effectively illustrates a reference voltage kickback comparison between the example conventional transceiver and the example transceiver of the present technology.

Namely, curve 924 illustrates peak-to-peak noise produced on a first reference voltage signal (REFP-C) supplied to a gate terminal of a first reference voltage signal-receiving MOS device of a voltage mode cascoded driver in the conventional transceiver. As can be seen by comparing curve 924 to plot 910, each time voltage of the I/O pad toggled from a maximum value to a minimum value (and vice versa), noise on REFP-C spiked dramatically. As alluded to above, this noise/disturbance on REFP-C was caused by voltage kickback experienced at the gate terminal of the first reference voltage signal-receiving MOS device of the voltage mode cascoded driver implemented in the conventional transceiver. As alluded to above, noise/disturbance on REFP-C can negatively impact reliability and performance for the transceiver.

Curve 922 illustrates peak-to-peak noise produced on a first reference voltage signal (REFP-P) supplied to a gate terminal of a first reference voltage signal-receiving MOS device of a voltage mode cascoded driver implemented in the transceiver of the present technology. As can be seen by comparing curve 922 to 924, toggling I/O pad voltage caused much less noise on REFP-P than REFP-C. As alluded to above, this may result from reduced voltage kickback at the gate terminal of the first reference voltage signal-receiving MOS device of the voltage mode cascoded driver implemented in the transceiver of the present technology. That is, by reducing reference voltage kickback at the gate terminals of reference voltage signal-receiving MOS devices, transceivers of the present technology can reduce disturbance/noise on reference voltage signals. By reducing disturbances to reference voltage signals, the protection provided by the reference voltage signals may be improved, and reliability for the transceivers may be improved/maintained. Relatedly, reducing voltage kickback can also improve performance for the transceivers.

Plot 930 is the same/similar as plot 920 except curve 934 illustrates peak-to-peak noise produced on a second reference voltage signal (REFN-C) supplied to a gate terminal of a second reference voltage signal-receiving MOS device of the voltage mode cascoded driver implemented in the conventional transceiver. Relatedly, curve 932 illustrates peak-to-peak noise produced on a second reference voltage signal (REFN-P) supplied to a gate terminal of a second reference voltage signal-receiving MOS device of the voltage mode cascoded driver implemented in the transceiver of the present technology. As can be seen by comparing curve 932 to curve 934, toggled I/O pad voltage caused much less noise on REFN-P than REFN-C.

FIG. 10 depicts an example table 1000 summarizing results from the above-described example experiments. As can be seen from table 1000, reference voltage kickback and I/O pad capacitance were significantly reduced for the transceiver of the present technology as compared to the conventional transceiver. Again, this illustrates that by tracking I/O pad voltage in receiver modes, embodiments of the present technology can significantly reduce voltage kickback and I/O pad capacitance.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (Saas). The processes and algorithms may be implemented partially or wholly in application-specific circuitry. The various features and processes described above may be used independently of one another or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAS, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto.

As used herein, two electrical components (e.g., a MOS device and an I/O pad of a transceiver) may be "electrically connected" if an electrical current can run between them through one or more electrical conductors/components. Such an electrical connection can be "direct" or "indirect." For example, a MOS device may be "directly" electrically connected to an I/O pad of a transceiver if a wire (or similar electrical conductor) connects the MOS device and I/O pad with no additional electrical components between them. The MOS device may be "indirectly" electrically connected to the I/O pad if one or more additional electrical components (e.g., one or more resistors) are electrically connected between the MOS device and the I/O pad. In either situation, the MOS device and I/O pad are "electrically connected" (as used herein) as an electrical current can run between them through one or more electrical conductors/components.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A transceiver, comprising:

a metal-oxide semiconductor (MOS) device that is electrically connected to an input/output (I/O) pad of the transceiver via a drain terminal of the MOS device;

a reference voltage kickback reduction circuit electrically connected to a gate terminal of the MOS device such that the reference voltage kickback reduction circuit supplies a reference voltage signal to the gate terminal of the MOS device, the reference voltage kickback reduction circuit is configured to drive the reference voltage signal to dynamically track voltage of the I/O pad when the transceiver is in a receiver mode; and a second reference voltage kickback reduction circuit electrically connected to a gate terminal of a second MOS device such that the second reference voltage kickback reduction circuit supplies a second reference voltage signal to the gate terminal of the second MOS device, the second reference voltage kickback reduction circuit is configured to drive the second reference voltage signal to dynamically track voltage of the I/O pad in a transceiver mode, including driving the second reference voltage signal to a pre-reference voltage when the voltage of the I/O pad is maximum and driving the second reference voltage signal to the voltage of the I/O pad when the voltage of the I/O pad is minimum.

2. The transceiver of claim 1, wherein:

the second MOS device is electrically connected to the I/O pad via a drain terminal of the second MOS device.

3. The transceiver of claim 1, wherein:

driving, by the reference voltage kickback reduction circuit, the reference voltage signal to dynamically track the voltage of the I/O pad comprises driving the reference voltage signal to the voltage of the I/O pad when the voltage of the I/O pad is maximum and driving the reference voltage signal to a first pre-reference voltage when the voltage of the I/O pad is minimum.

4. The transceiver of claim 1, wherein:

driving, by the reference voltage kickback reduction circuit, the reference voltage signal to dynamically track the voltage of the I/O pad comprises driving the reference voltage signal to the voltage of the I/O pad for all values of the voltage of the I/O pad.

5. A transceiver, comprising:

a metal-oxide semiconductor (MOS) device that is electrically connected to an input/output (I/O) pad of the transceiver via a drain terminal of the MOS device; and a reference voltage kickback reduction circuit electrically connected to a gate terminal of the MOS device such that the reference voltage kickback reduction circuit supplies a reference voltage signal to the gate terminal of the MOS device, the reference voltage kickback reduction circuit is configured to drive the reference voltage signal to dynamically track voltage of the I/O pad when the transceiver is in a receiver mode, the reference voltage kickback reduction circuit includes a first sub-circuit that drives the reference voltage signal when the transceiver is in the receiver mode and the voltage of the I/O pad is maximum, a second sub-circuit drives the reference voltage signal when the transceiver is in the receiver mode and the voltage of the I/O pad is minimum and a third sub-circuit drives the reference voltage signal when the transceiver is in a transmitter mode.

6. The transceiver of claim 5, wherein:

the first sub-circuit drives the reference voltage signal to the voltage of the I/O pad when the transceiver is in the receiver mode and the voltage of the I/O pad is maximum;

the second sub-circuit drives the reference voltage signal to a first pre-reference voltage when the transceiver is in the receiver mode and the voltage of the I/O pad is minimum; and the third sub-circuit drives the reference voltage signal to the first pre-reference voltage when the transceiver is in the transmitter mode.

7. The transceiver of claim 6, wherein:

the first sub-circuit comprises a first pull-up transistor and a second pull-up transistor;

a source terminal of the first pull-up transistor is supplied with the voltage of the I/O pad;

a drain terminal of the first pull-up transistor is electrically connected to a source terminal of the second pull-up transistor;

a drain terminal of the second pull-up transistor is electrically connected to the gate terminal of the MOS device; and when the transceiver is in the receiver mode and the voltage of the I/O pad is maximum:

a gate terminal of the first pull-up transistor is supplied with the first pre-reference voltage such that the first pull-up transistor is enabled, a gate terminal of the second pull-up transistor is supplied with the first pre-reference voltage such that the second pull-up transistor is enabled, and with the first and second pull-up transistors enabled, the first sub-circuit drives the reference voltage signal to the voltage of the I/O pad.

8. The transceiver of claim 7, wherein:

the second sub-circuit comprises a third pull-up transistor and a fourth pull-up transistor;

a source terminal of the third pull-up transistor is supplied with the first pre-reference voltage;

a drain terminal of the third pull-up transistor is electrically connected to a source terminal of the fourth pull-up transistor;

a drain terminal of the fourth pull-up transistor is electrically connected to the gate terminal of the MOS device; and when the transceiver is in the receiver mode and the voltage of the I/O pad is minimum:

a gate terminal of the third pull-up transistor is supplied with a ground voltage such that the third pull-up transistor is enabled, a gate terminal of the fourth pull-up transistor is supplied with the voltage of the I/O pad such that the fourth pull-up transistor is enabled, and with the third and fourth pull-up transistors enabled, the second sub-circuit drives the reference voltage signal to the first pre-reference voltage.

9. The transceiver of claim 8, wherein:

the third sub-circuit comprises a pull-down transistor;

a source terminal of the pull-down transistor is supplied with the first pre-reference voltage;

a drain terminal of pull-down transistor is electrically connected to the gate terminal of the MOS device; and when the transceiver is in the transmitter mode:

a gate terminal of the pull-down transistor is supplied with a supply voltage of the transceiver such that the pull-down transistor is enabled, and with the pull-down transistor enabled, the third sub-circuit drives the reference voltage signal to the first pre-reference voltage.

10. The transceiver of claim 1, wherein the first MOS device and the second MOS device are reference voltage signal-receiving MOS devices of a voltage mode cascoded driver segment.

11. The transceiver of claim 10, wherein:

the voltage mode cascoded driver segment is part of a multi-segment voltage mode cascoded driver implemented in the transceiver; and when the transceiver is in a transmitter mode and the voltage mode cascoded driver segment is inactive, the reference voltage kickback reduction circuit and the second reference voltage kickback reduction circuit drive the reference voltage signal and the second reference voltage signal respectively to dynamically track the voltage of the I/O pad.

12. A transceiver comprising:

a first reference voltage kickback reduction circuit electrically connected to a gate terminal of a first MOS device such that the first reference voltage kickback reduction circuit supplies a first reference voltage signal to the gate terminal of the first MOS device; and a second reference voltage kickback reduction circuit electrically connected to a gate terminal of a second MOS device such that the second reference voltage kickback reduction circuit supplies a second reference voltage signal to the gate terminal of the second MOS device;

wherein:

the first MOS device and the second MOS device are electrically connected to an I/O pad of the transceiver via drain terminals of the first MOS device and the second MOS device respectively, and when the transceiver is in a receiver mode:

the first reference voltage kickback reduction circuit drives the first reference voltage signal to voltage of the I/O pad when the voltage of the I/O pad is maximum and drives the first reference voltage signal to a first pre-reference voltage when the voltage of the I/O pad is minimum, and the second reference voltage kickback reduction circuit drives the second reference voltage signal to a second pre-reference voltage when the voltage of the I/O pad is maximum and drives the second reference voltage signal to the voltage of the I/O pad when the voltage of the I/O pad is minimum.

13. The transceiver of claim 12, wherein:

the second reference voltage kickback reduction circuit comprises a first sub-circuit, a second sub-circuit, and a third sub-circuit electrically connected to each other in parallel;

the first sub-circuit drives the second reference voltage signal to the second pre-reference voltage when the transceiver is in the receiver mode and the voltage of the I/O pad is maximum;

the second sub-circuit drives the second reference voltage signal to the voltage of the I/O pad when the transceiver is in the receiver mode and the voltage of the I/O pad is minimum; and the third sub-circuit drives the second reference voltage to the second pre-reference voltage when the transceiver is in a transmitter mode.

14. The transceiver of claim 13, wherein:

the first sub-circuit comprises a first pull-down transistor and a second pull-down transistor;

a source terminal of the first pull-down transistor is supplied with the second pre-reference voltage;

a drain terminal of the first pull-down transistor is electrically connected to a source terminal of the second pull-down transistor;

a drain terminal of the second pull-down transistor is electrically connected to the gate terminal of the second MOS device; and when the transceiver is in the receiver mode and the voltage of the I/O pad is maximum:

a gate terminal of the first pull-down transistor is supplied with a supply voltage of the transceiver such that the first pull-down transistor is enabled, a gate terminal of the second pull-up transistor is supplied with the voltage of the I/O pad such that the second pull-down transistor is enabled, and with the first and second pull-up transistors enabled, the first sub-circuit drives the second reference voltage signal to the second pre-reference voltage.

15. The transceiver of claim 14, wherein:

the second sub-circuit comprises a third pull-down transistor and a fourth pull-down transistor;

a source terminal of the third pull-down transistor is supplied with the I/O pad voltage;

a drain terminal of the third pull-down transistor is electrically connected to a source terminal of the fourth pull-down transistor;

a drain terminal of the fourth pull-down transistor is electrically connected to the gate terminal of the second MOS device; and when the transceiver is in the receiver mode and the voltage of the I/O pad is minimum:

a gate terminal of the third pull-down transistor is supplied with the second pre-reference voltage such that the third pull-down transistor is enabled, a gate terminal of the fourth pull-down transistor is supplied with the second pre-reference voltage such that the fourth pull-down transistor is enabled, and with the third and fourth pull-down transistors enabled, the second sub-circuit drives the second reference voltage signal to the voltage of the I/O pad.

16. The transceiver of claim 15, wherein:

the third sub-circuit comprises a pull-up transistor;

a source terminal of the pull-up transistor is supplied with the second pre-reference voltage;

a drain terminal of pull-up transistor is electrically connected to the gate terminal of the second MOS device; and when the transceiver is in the transmitter mode:

a gate terminal of the pull-up transistor is supplied with a ground voltage such that the pull-up transistor is enabled, and with the pull-up transistor enabled, the third sub-circuit drives the second reference voltage signal to the second pre-reference voltage.

17. The transceiver of claim 12, wherein the first MOS device and the second MOS device are reference voltage signal-receiving MOS devices of a voltage mode cascoded driver segment.

18. The transceiver of claim 17, wherein:

the voltage mode cascoded driver segment is part of a multi-segment voltage mode cascoded driver implemented in the transceiver; and when the transceiver is in a transmitter mode and the voltage mode cascoded driver segment is inactive:

the first reference voltage kickback reduction circuit drives the first reference voltage signal to the voltage of the I/O pad when the voltage of the I/O pad is maximum and drives the first reference voltage signal to the first pre-reference voltage when the voltage of the I/O pad is minimum, and the second reference voltage kickback reduction circuit drives the second reference voltage signal to the second pre-reference voltage when the voltage of the I/O pad is maximum and drives the second reference voltage signal to the voltage of the I/O pad when the voltage of the I/O pad is minimum.

19. The transceiver of claim 12, wherein the first MOS device is a pull-up device and the second MOS device is a pull-down device.

20. A transceiver comprising:

a metal-oxide semiconductor (MOS) device that is electrically connected to an input/output (I/O) pad of the transceiver via a drain terminal of the MOS device; and a reference voltage kickback reduction circuit electrically connected to a gate terminal of the MOS device such that the reference voltage kickback reduction circuit supplies a reference voltage signal to the gate terminal of the MOS device, the reference voltage kickback reduction circuit is configured to drive the reference voltage signal to the voltage of the I/O pad in a receiver mode with a high I/O pad voltage, drive the reference voltage signal to a pre-reference voltage in the receiver mode with a low I/O pad voltage and drive the reference voltage to the pre-reference voltage in a transmitter mode.

* * * * *